US012593423B2

(12) United States Patent
Scott et al.

(10) Patent No.: US 12,593,423 B2
(45) Date of Patent: Mar. 31, 2026

(54) FLOW-THROUGH FOLDING MEMBRANE ACCUMULATOR FOR LIQUID COOLING SYSTEM

(71) Applicant: HEWLETT PACKARD ENTERPRISE DEVELOPMENT LP, Spring, TX (US)

(72) Inventors: Michael Dustin Scott, Chippewa Falls, WI (US); Steven J. Dean, Chippewa Falls, WI (US); Harvey John Lunsman, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 254 days.

(21) Appl. No.: 18/491,910

(22) Filed: Oct. 23, 2023

(65) Prior Publication Data

US 2025/0133695 A1     Apr. 24, 2025

(51) Int. Cl.
*H05K 7/20* (2006.01)
*F04D 1/00* (2006.01)
*F04D 17/00* (2006.01)

(52) U.S. Cl.
CPC ..... *H05K 7/20272* (2013.01); *H05K 7/20281* (2013.01); *F04D 1/00* (2013.01); *F04D 17/00* (2013.01)

(58) Field of Classification Search
None
See application file for complete search history.

(56) References Cited

U.S. PATENT DOCUMENTS

| | | | | |
|---|---|---|---|---|
| 2,867,240 | A | | 1/1959 | Bent |
| 3,878,867 | A | | 4/1975 | Dirks |
| 5,401,404 | A | * | 3/1995 | Strauss .............. B01D 17/0208 |
| | | | | 210/94 |

(Continued)

FOREIGN PATENT DOCUMENTS

| | | | |
|---|---|---|---|
| DE | 102020104891 A1 | 8/2021 | |
| WO | 2017/093765 A1 | 6/2017 | |

OTHER PUBLICATIONS

Bell III, D. et al., "Apollo Experience Report—Power Generation System," NASA Technical Note, Mar. 1973, 20 pages.

(Continued)

*Primary Examiner* — Courtney L Smith

(74) *Attorney, Agent, or Firm* — Jones Robb, PLLC

(57) ABSTRACT

A flow-through folding membrane accumulator comprises a hollow cylindrical housing and a folding flexible membrane disposed in an interior volume of the housing. The membrane defines an interior liquid channel extending through the membrane along a longitudinal axis, and liquid coolant flows from an inlet of the accumulator through the interior liquid channel to an outlet of the accumulator. The membrane is sealed to the housing such that an air-tight cavity filled with a gas is formed between the housing and the membrane. The cavity radially surrounds the internal liquid channel, with the membrane separating the cavity and the internal liquid channel. Volumes of the cavity and channel change in response to deformation of the membrane and based on pressures of the liquid coolant. The membrane may comprise multiple folds extending parallel to the longitudinal axis and distributed circumferentially around the axis.

20 Claims, 19 Drawing Sheets

(56) References Cited

U.S. PATENT DOCUMENTS

| | | | | |
|---|---|---|---|---|
| 6,494,545 B2 * | 12/2002 | Nakamura | ................ | F15B 1/08 |
| | | | | 303/DIG. 11 |
| 6,789,577 B2 | 9/2004 | Baltes | | |
| 6,810,915 B2 * | 11/2004 | Umetsu | ................... | F15B 1/103 |
| | | | | 220/721 |
| 7,353,845 B2 | 4/2008 | Underwood et al. | | |
| 8,434,524 B2 | 5/2013 | Barth et al. | | |
| 8,991,433 B2 | 3/2015 | Baseley | | |
| 12,105,538 B2 * | 10/2024 | Scott | ....................... | F15B 1/021 |
| 12,324,131 B2 * | 6/2025 | Amalfi | ............... | H05K 7/20327 |
| 12,372,090 B2 * | 7/2025 | Brunvold | ................ | C02F 1/442 |
| 2005/0241799 A1 | 11/2005 | Malone et al. | | |
| 2008/0063544 A1 * | 3/2008 | Duncan | ................... | F04B 49/22 |
| | | | | 417/401 |
| 2014/0368991 A1 * | 12/2014 | James | ................ | H05K 7/20781 |
| | | | | 361/679.52 |
| 2020/0003463 A1 * | 1/2020 | Kariya | ................... | F25B 43/02 |
| 2021/0087914 A1 * | 3/2021 | Nalley, Jr. | ............. | E21B 43/243 |
| 2021/0243919 A1 * | 8/2021 | Iyengar | ................... | F28D 15/00 |

OTHER PUBLICATIONS

Wilkes & McLean, Ltd., "Accumulators," Retrieved online Aug. 15, 2023, https://wilkesandmclean.com/acc_why_top_1.html.

European search report received for EP Application No. 24169612.9, mailed on Sep. 23, 2024, 12 pages.

* cited by examiner

200

200

200

FLOW-THROUGH FOLDING MEMBRANE ACCUMULATOR FOR LIQUID COOLING SYSTEM

INTRODUCTION

Information processing devices, such as computers, networking devices, etc., generate heat when in use. Cooling systems may be utilized to remove heat from components of the information processing devices to keep them within desired operating temperatures. For example, liquid cooling techniques may use flows of liquid coolant to remove heat from the system. In such liquid cooling techniques, a cold plate is thermally coupled with the component that needs cooling and a flow of liquid coolant can be used to transfer heat from the component to the liquid coolant. In systems that utilize liquid cooling techniques, the flows of liquid coolant are delivered via liquid cooling infrastructure such as pumps, coolant lines, fluid couplings, heat exchanges, etc. This infrastructure may form a liquid cooling loop which may service multiple information processing devices, such as one or more entire racks or cabinets of information processing devices.

One piece of liquid cooling infrastructure is an accumulator. The accumulator is a device which acts like a hydraulic spring to help regulate the pressure within the liquid cooling loop, absorbing transient pressure spikes or drops (such as may occur due to thermal expansion/contraction, plugging in of new devices, etc.). The accumulator comprises a chamber filled with liquid and connected to the liquid cooling loop, wherein the liquid chamber is bounded by a movable barrier (e.g., piston, bladder, diaphragm) such that the volume within the chamber can change based on movement of the barrier. The liquid within the chamber pushes against the movable barrier, and the movable barrier is biased to push back against the liquid. An equilibrium is reached in which the pressure in the liquid chamber balances the opposing biasing forces acting on the movable barrier. The biasing forces may be generated by pressure on the opposite side of the barrier (e.g., from compressed air) and/or from mechanical biasing mechanisms (e.g., the barrier's elastic resistance to deformation). Thus, for example, if the liquid in the liquid cooling loop expands in overall volume due to thermal expansion, the liquid chamber can expand to accommodate the excess volume by compressing or otherwise moving the movable barrier. In contrast, without the accumulator, the expansion in volume of the liquid may generate sufficient pressure to burst a pipe or fitting, due to the incompressibility of the liquid.

One type of accumulator is a bladder accumulator, in which the movable barrier is a flexible bladder, filled with gas and sealed. The bladder is disposed in the chamber with the liquid surrounding it. In these accumulators, the biasing force is generated by the pressure of the gas inside the bladder pushing the bladder outward. Another type of accumulator is a diaphragm (or membrane) accumulator, in which the movable barrier is a flexible diagram (membrane) which separates a larger vessel into two chambers, one being the liquid chamber and the other filled with gas. The diaphragm accumulator operates similarly to the bladder accumulator. Another type of accumulator is a piston accumulator, in which the movable barrier is a piston. The liquid is disposed on one side of the piston and the other side of the piston is biased press the piston against the liquid, either by a spring, weights, or by compressed gas.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings.

DETAILED DESCRIPTION

Figure 1:
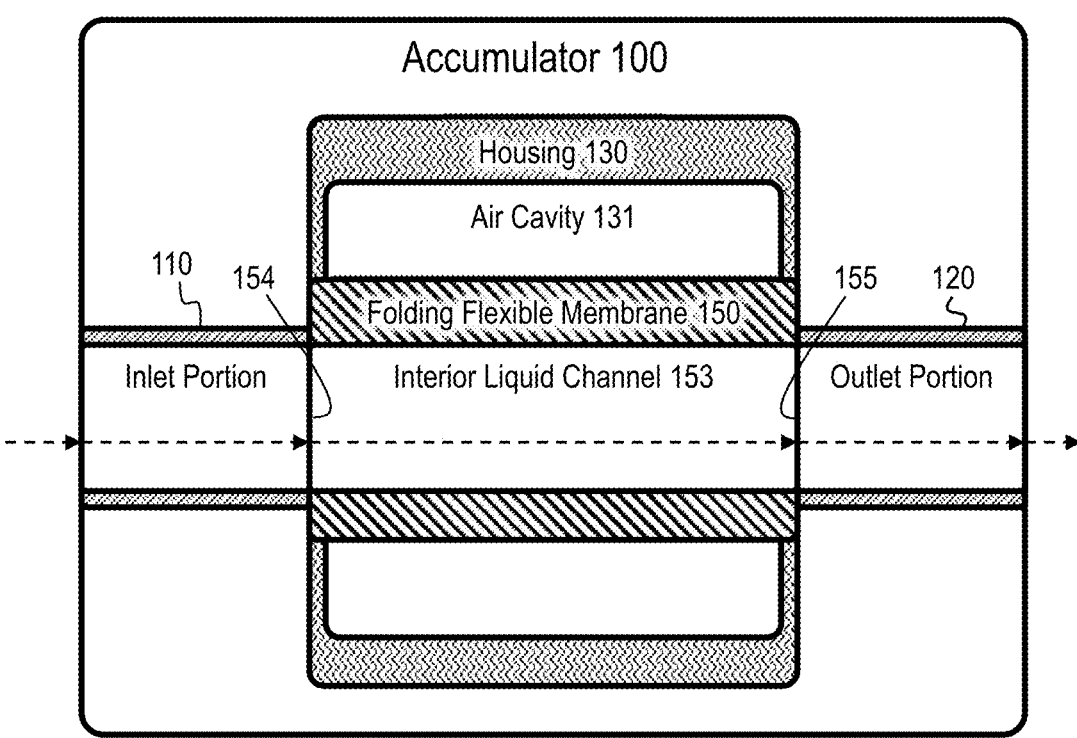
FIG. 1 is a block diagram schematically illustrating an example flow-through folding membrane accumulator.

In accumulators used in liquid cooling systems, the liquid chamber of the accumulator is usually not part of the flow path of fluid flowing through the liquid cooling loop. That is, although the liquid chamber is fluidically coupled to the liquid cooling loop, the liquid chamber is generally arranged to the side of the main liquid flow path such that the liquid flowing through the loop largely bypasses the liquid chamber. Some small amounts of liquid may enter or leave the liquid chamber occasionally as pressure fluctuates in the system, but overall the liquid in the chamber remains mostly undisturbed and is not recirculated. Thus, the liquid in the chamber of the accumulator can become stagnant. The chemicals in the stagnant liquid can degrade and/or come out of solution such that the chemistry of the liquid in the accumulator no longer meets the requirements needed to maintain corrosion inhibition and biological growth inhibition. As a result, the stagnant liquid may start to develop biological or other contamination, and that contamination can then spread into the rest of the liquid cooling loop. The contamination can also cause corrosive effects and blockages in the fluid flow path.

A technical solution to the issues described above comprises a flow-through accumulator having a liquid channel that is configured to be coupled to a liquid flow path of a liquid cooling system such that, when the liquid is flowing along the liquid flow path, at least a portion of the liquid continuously flows through the liquid channel of the accumulator. Thus, the liquid in the accumulator is continuously recirculated and does not become stagnant.

In some examples, the accumulator comprises a flexible membrane formed into a tube-like shape having an inlet opening and an outlet opening with an interior channel extending along a longitudinal axis between the inlet and outlet openings. The interior channel forms the liquid channel of the accumulator, with liquid being received at the inlet opening, flowing through the channel along the axial direction, and exiting via the outlet opening. The membrane comprises a number of folds extending parallel to the axis and distributed circumferentially around the axis, wherein the folds alternate in their fold direction (inward vs outward) to form a series of folded portions, which bound and define the interior liquid channel. Each individual folded portion may be shaped like an elongated trough (from a perspective exterior to the membrane) or an elongated ridge (from a perspective inside the liquid channel) extending along the longitudinal axis, with a generally V- or U-shaped cross-section. For example, in cross-section the membrane may have a star-like shape. The accumulator also comprises a hollow cylindrical housing. The flexible membrane is positioned inside the housing and sealed thereto such that an air-tight cavity is defined in the space between the housing and the membrane, with the cavity radially surrounding the flexible membrane. This cavity is filled with gas (e.g., air, nitrogen, or any other gas), and may be referred to as an air cavity for convenience. The membrane divides the air cavity from the interior liquid channel, and because the membrane is flexible and the folded portions thereof can deform, the respective volumes of the interior liquid channel and the air cavity can change in inverse relation to one another. Thus, as pressures in the liquid channel fluctuate, the folded portions of the membrane may deform so as to absorb and offset these pressure changes, in a similar fashion to how the bladder or diaphragm absorbs and offsets pressure changes in other accumulators.

The above-described configuration of the accumulator in which the flexible membrane defines the interior liquid channel extending between an inlet and an outlet and in which the housing and flexible membrane define the air cavity radially surrounding the interior liquid channel in a concentrically nested configuration allows for the liquid of the cooling loop to continuously flow through the accumulator while also allowing the membrane and air cavity to react to pressure changes therein.

Turning now to the figures, various devices, systems, and methods in accordance with aspects of the present disclosure will be described.

FIG. 1 is a block diagram schematically illustrating an accumulator 100. It should be understood that FIG. 1 is not intended to illustrate specific shapes, dimensions, or other structural details accurately or to scale, and that implementations of the accumulator 10 may have different numbers and arrangements of the illustrated components and may also include other parts that are not illustrated. In FIG. 1, liquid flow paths are indicated by dashed arrows.

The accumulator 100 is a flow-through folded membrane accumulator. As shown in FIG. 1, the accumulator 100 comprises a housing 130, a folding flexible membrane 150, an inlet portion 110, and an outlet portion 120. These will be described in greater detail in turn below.

The inlet portion 110 comprises an inlet coupler (not illustrated) configured to fluidically couple the accumulator 10 to a liquid cooling loop. For example, the inlet coupler may be a quick-disconnect (QD) fluid coupler, a hose-barb coupler, a threaded coupler, or any other form of liquid coupler. The inlet portion 110 may also comprise other conduits or structures which guide the liquid received at the inlet coupler to the channel 153 (described below). The inlet portion 110 may also comprise a first cap which seals a first end of the accumulator 110, with the inlet coupler being coupled to the first cap.

The outlet portion 120 comprises an outlet coupler (not illustrated) configured to fluidically couple the accumulator 10 to a liquid cooling loop. For example, the outlet coupler may be a quick-disconnect (QD) fluid coupler, a hose-barb coupler, a threaded coupler, or any other form of liquid coupler. The outlet portion 120 may also comprise other conduits or structures which guide the liquid expelled from the channel 153 to the outlet coupler. In some examples, the outlet portion 120 may also comprise a second cap which seals a second end of the accumulator 110, opposite the first end. In some examples, the outlet coupler is coupled (directly, or indirectly via a hose or other structure) to the second cap. In other examples, the outlet coupler is coupled to the first cap (i.e., both the inlet and outlet couplers are coupled to the same cap). In examples in which the both the inlet and outlet couplers are coupled to the first cap, the outlet portion 120 may comprise conduits which extend through the accumulator in a direction opposite to that which the liquid flows through the channel 153. That is, in such examples, liquid initially flows from the inlet coupler at a first end of the accumulator 110 in a first direction through the channel 153, and then after exiting the channel 153 at the second end of the accumulator 115 the fluid is turned around and flows, via conduits of the outlet portion 120, back in a second direction to the outlet coupler at the first end.

The folding flexible membrane 150 comprises a material that is flexible and impermeable to water and air. For example, the folding flexible membrane 150 may comprise rubber (natural or synthetic) (e.g., EPDM rubber), silicon, or a flexible plastic. The membrane 150 is formed into a tube-like shape having an inlet opening 154 (coupled to the inlet portion 110) and an outlet opening 155 (coupled to the outlet portion 120) with an interior liquid channel 153 extending along a longitudinal axis between the inlet and outlet openings. As indicated schematically in FIG. 1, the interior liquid channel 153 is radially surrounded and defined by the flexible membrane 150. As shown by the dashed arrows, liquid from the inlet portion 110 may enter the inlet opening 154, flow through the channel 153 along the axial direction, and exit the channel 153 to the outlet portion 120 via the outlet opening 155.

In some examples, the membrane 150 comprises a number of folds extending parallel to the axis and distributed circumferentially around the axis, wherein the folds alternate in direction to form a series of folded portions, which bound and define the interior liquid channel 153. The exact shape of the folding membrane 150 in a resting state (e.g., when liquid channel 153 is at neutral pressure) can vary from one accumulator 100 to the next, but generally comprises the folded portions being circumferentially distributed around the central axis. In some examples, in the resting state, each individual folded portion may be shaped like an elongated trough (from a perspective exterior to the membrane) or an elongated ridge (from a perspective inside the liquid channel) extending along the longitudinal axis, with a generally V- or U-shaped cross-section. For example, in cross-section the membrane 150 may have a star-like shape when in the resting state, in some implementations. The folded portions are flexible and thus may deform and change their shape depending on the pressure of the liquid in the interior liquid channel 153. As the pressure in the liquid channel 153 is increased, the folded portions are pushed outward and deformed such that the folds thereof begin to straighten out (unfold). On the other hand, as the pressure in the liquid channel 153 decreases, the air pressure in the air cavity 131 pushes the folded portions back towards their resting state shape.

The shape of the membrane 150 at high pressure will differ from the shape of the membrane 150 at the resting state due to the deformation of the folding portions. The ultimate shape of the membrane 150 at the highest rated pressure of the accumulator 100 will depend upon the size of the housing 130 and the material used for the membrane 150, including its properties related to how far it can bend without risk of cracking. In some examples, the folds will almost fully unfold when the pressure in the liquid channel 153 reaches a high pressure threshold (e.g., a maximum rated pressure for the accumulator 100), resulting in the profile of the membrane 150 in cross-section becoming approximately a circle (in some cases, some jaggedness or bumpiness may remain at the locations of the folds). The nearly circular profile may be achieved in cases in which the membrane 150 material is sufficiently flexible and robust so as to avoid cracking or splitting throughout the range of motion and deformation involved. In other examples, to avoid cracking or splitting, the maximum rated pressure for the accumulator 100 may be set to a level lower than the above-described high pressure threshold such that, when the maximum rated pressure is reached, the folds of the membrane 150 have not fully straightened out and the profile in cross-section of the membrane 150 is not circular. The exact shape that is reached at the maximum pressure will vary from one accumulator 100 to the next based on the materials used, the dimensions thereof, and what the maximum pressure is set to. Regardless of what the maximum pressure is set to or what the shape of the membrane 150 is when at the maximum pressure, in each example the membrane 150 is sufficiently flexible to change shape back and forth between the resting state shape and the maximum pressure state shape as the pressure fluctuates in the liquid channel 153.

The accumulator also comprises a hollow cylindrical housing 130. The housing 130 comprises a rigid and strong material, such as PVC, plastic, copper, stainless steel, brass, aluminum, or any other materials suitable for forming a pipe or liquid conduit capable of withstanding the pressures of the liquid cooling loop (e.g., about 0 to 250 PSI (0 to $1.72 \times 10^6$ Pa) in some examples). As shown in FIG. 1, the flexible membrane 150 is positioned inside the housing 130 and sealed thereto such that an air-tight cavity 131 is defined in the space between the housing 130 and the membrane 150, with the cavity 131 radially surrounding the flexible membrane 150. Thus, the cavity 131 also radially surrounds the interior liquid channel 153, with the folding flexible membrane 150 separating the cavity 131 from the channel 153. This cavity 131 is filled with gas (e.g., air, nitrogen, or any other gas). The cavity 131 may be referred to as an air cavity 131 for convenience, but this does not limit which gas the cavity 131 may contain. The membrane 150 divides the air cavity 131 from the interior liquid channel 153, and because the membrane 150 is flexible and the folded portions thereof can deform, the respective volumes of the interior liquid channel 153 and the air cavity 131 can change in inverse relation to one another. Thus, as pressures in the liquid channel 153 fluctuate, the folded portions of the membrane 150 may deform so as to absorb and offset these pressure changes.

Turning now to FIGS. 4-10, another example flow-through folding membrane accumulator 200 will be described. The accumulator 200 is one example configuration of the accumulator 100. Thus, some components of the accumulator 200 correspond to (i.e., are the same as, similar to, and/or example configurations of) components of the accumulator 100 described above. The components of the accumulator 200 and the components of the accumulator 100 which correspond to one another are given reference numbers with the same last two digits, such as 150 and 250. The descriptions above of the components of the accumulator 100 are applicable to the corresponding components of the accumulator 200 (unless otherwise indicated or logically contradictory), and thus duplicative descriptions of some aspects already described above are omitted below.

FIGS. 2-10 show the accumulator 200 in various perspectives and in various states, and aspects of the accumulator 200 may be visible in multiple of the figures. The description below will refer to the figures as and when they are relevant to the aspect being described, rather than in strict numerical order.

Figure 2:
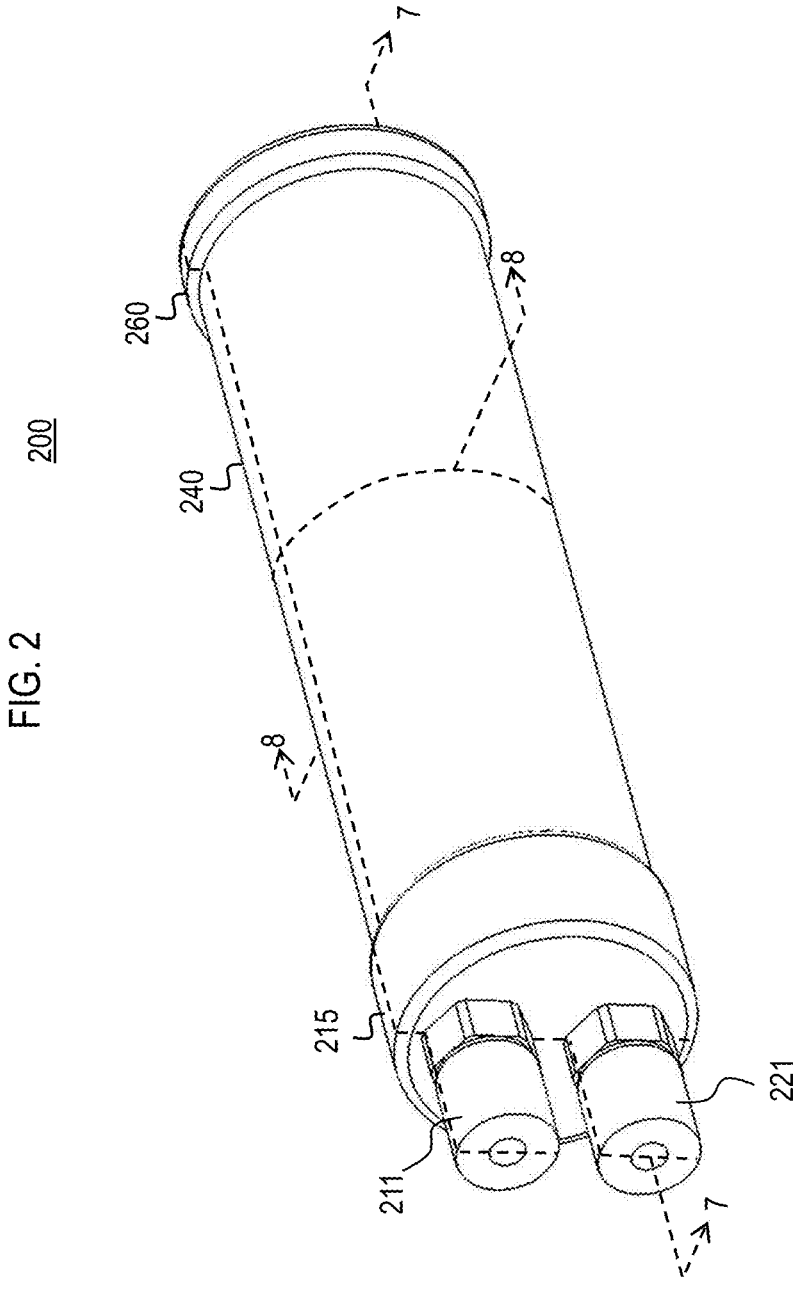
FIG. 2 is a perspective view of another example flow-through folding membrane accumulator having inlet and outlet couplings disposed on a same end.
Figure 3:
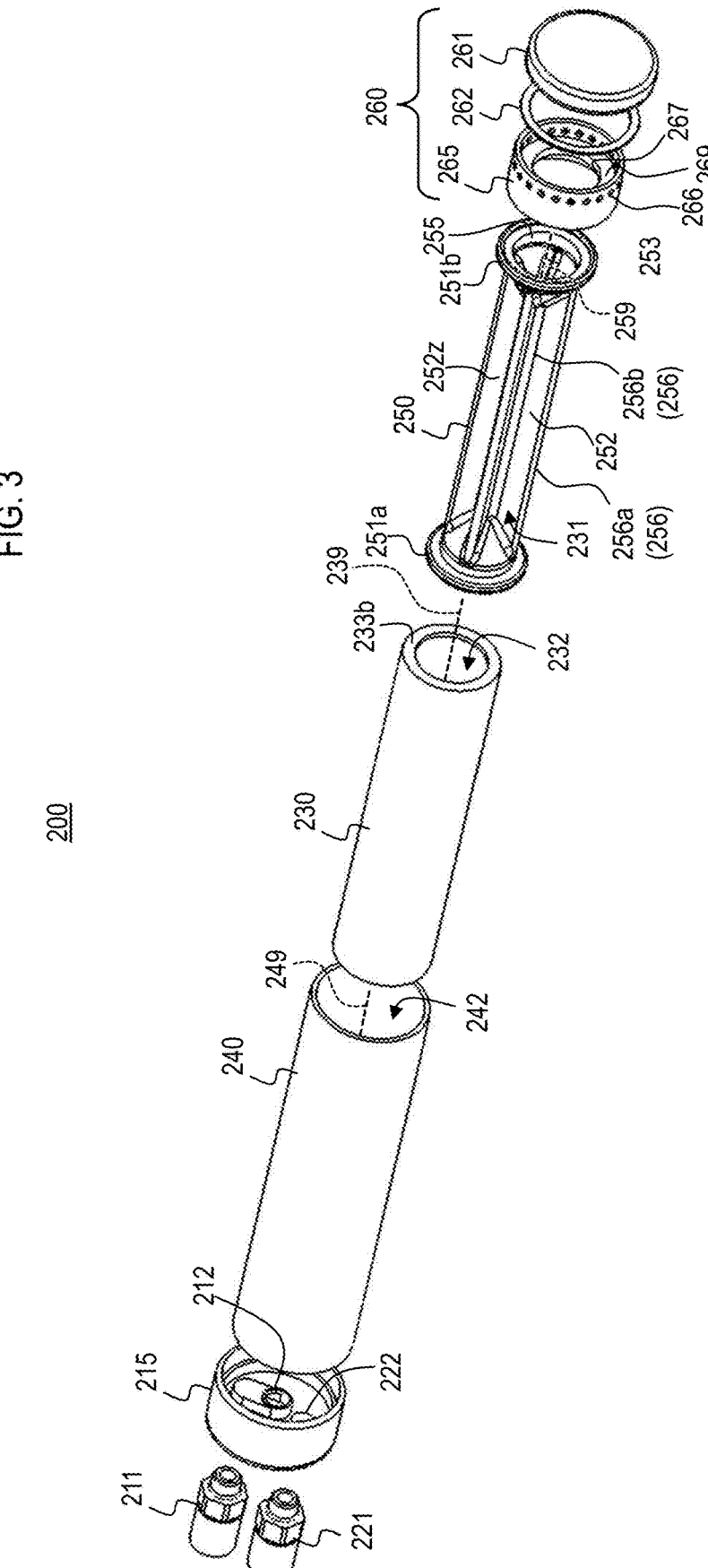
FIG. 3 is an exploded perspective view of the accumulator of FIG. 2.

As shown FIG. 2, the accumulator 200 comprises an outer housing 240, a first end cap 215, an inlet coupler 211, an outlet coupler 221, and a second end cap assembly 260. As shown in FIG. 3, the accumulator 200 also comprises an inner housing 230 and a folding flexible membrane 250. As shown in FIGS. 3-8B, the inner housing 230 is positioned within an interior volume 242 of the outer housing 240, and the membrane 250 is disposed within an interior volume 232 of the inner housing 230. In other words, the outer housing 240, inner housing 230, and membrane 250 are concentrically nested with their respective central longitudinal axes 249, 239, and 259 being aligned. The end caps 215 and 260 are coupled to opposite ends of the outer housing 240 and seal the outer housing 240 relative to an external environment in a water-tight manner, except for openings in the inlet coupler 211 and outlet coupler 221 which allow for fluid communication into and out from the otherwise sealed interior of the outer housing 240. The inner housing 230 is one configuration of the housing 130 described above. The folding flexible membrane 250 is one configuration of the folding flexible membrane 150 described above.

As shown in FIG. 2, in the illustrated example, the inlet coupler 211 and the outlet coupler 221 are both coupled to the same end cap, namely the first end cap 215. Thus, liquid flowing through the accumulator 200 first flows in a first direction (e.g., to the right in FIG. 7) and then turns and flows back in a second direction opposite the first direction. The inlet coupler 211 and the outlet coupler 221 comprise QD fluid couplers in one example. In other examples, any other type of fluid couplers may be used.

Figure 4:
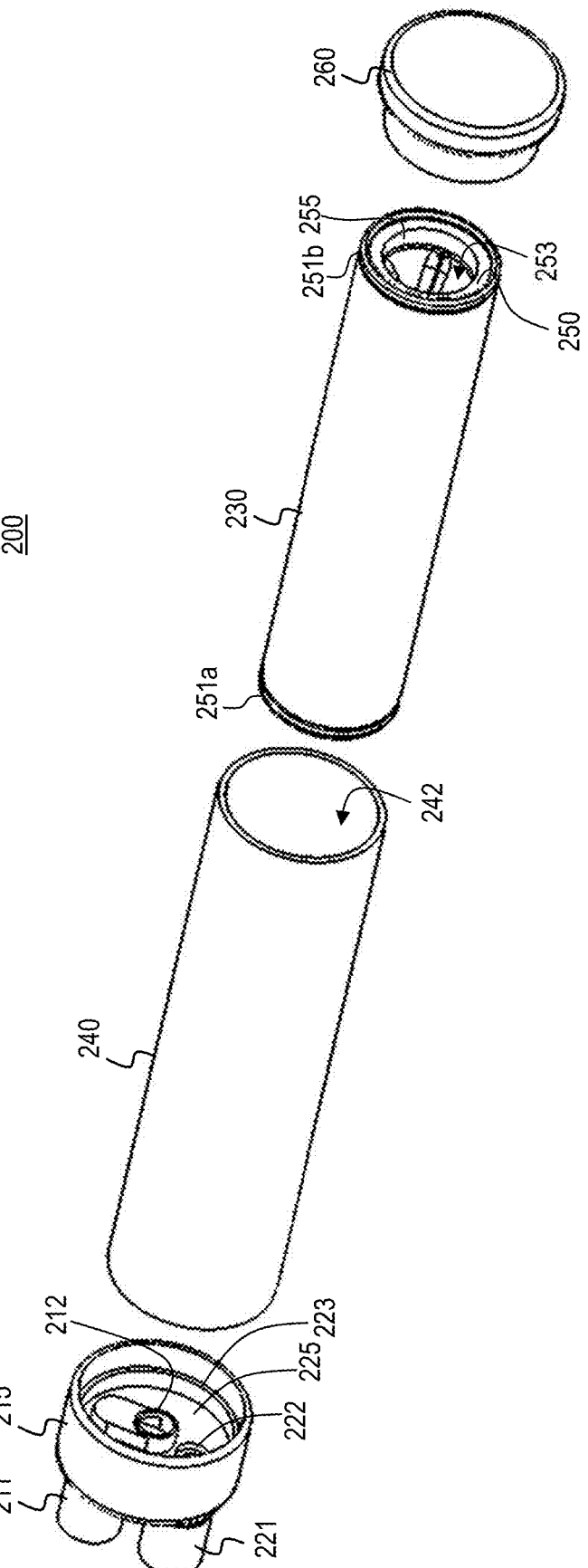
FIG. 4 is a partially exploded perspective view of the accumulator of FIG. 2.
Figure 6:
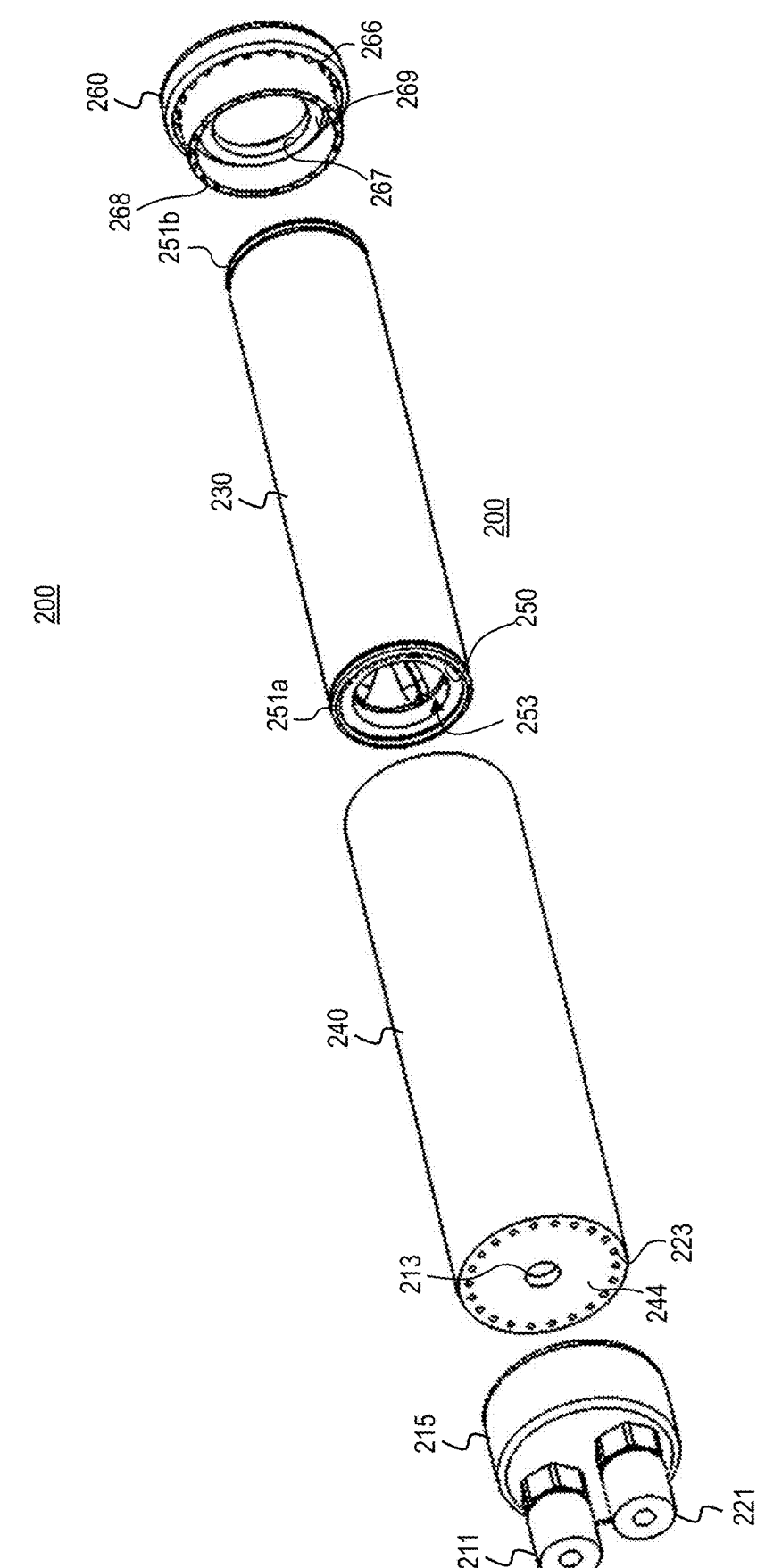
FIG. 6 is another partially exploded perspective view of the accumulator of FIG. 2.
Figure 7:
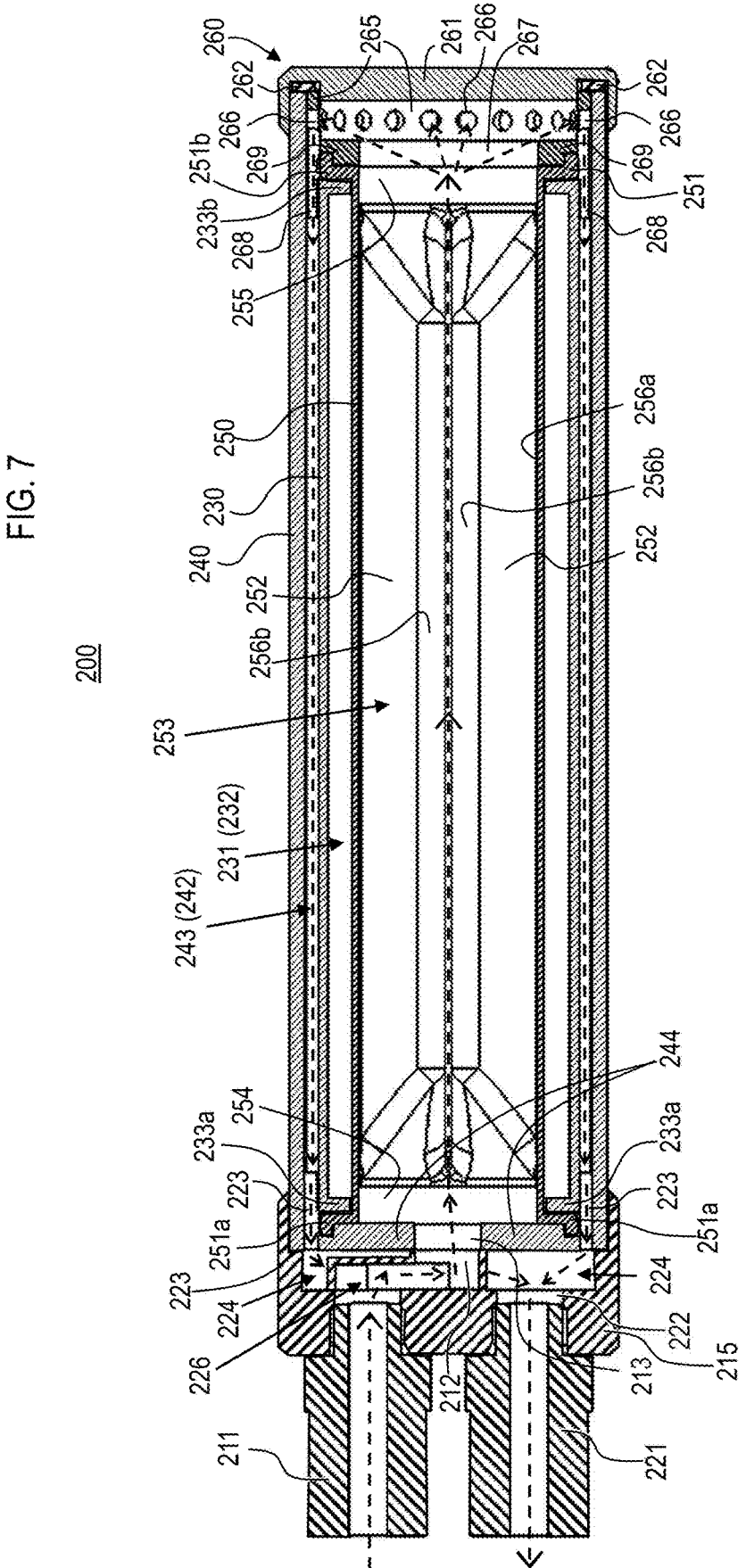
FIG. 7 is a cross-section of the accumulator of FIG. 2 with the section taken along a plane 7-7 indicated in FIG. 2.

As shown in FIG. 4, the first end cap 215 comprises an inlet conduit 212 formed on/in an interior face 225 of the end cap 215, with the inlet conduit 212 being fluidically coupled to the inlet coupler 211. As shown in FIG. 4, the inlet conduit 212 protrudes out from the interior face 225. Thus, as shown in FIG. 7, the inlet conduit 212 engages with the end face 244 of the outer housing 240, which allows the inlet conduit 212 to fluidically couple with an inlet opening 213 in the end face 244 (see also FIGS. 5 and 6 for views of the end face 244). Accordingly, as indicated by the dashed arrows in FIG. 7, liquid input to the accumulator 200 flows from the inlet coupling 211 into the outer housing 240 via the inlet coupling 212 and the inlet opening 213. This input liquid then flows from the inlet opening 213 into and then through the liquid channel 253, as will be described in greater detail below. The inlet coupler 211, the inlet conduit 212, and the inlet opening 213 thus together constitute one example configuration of the input portion 110 described above.

As shown in FIG. 7, after the liquid coolant flows through and exits the liquid channel 253, the liquid changes flow direction at the second end cap assembly 260 (which will be described in greater detail below) and flows back toward the first end cap 215 via an outlet conduit 243 formed by the space between the inner housing 230 and the outer housing 240. The liquid then enters a chamber 224 via outlets 223 formed through the end face 244 of the outer housing. The chamber 224 is defined by and between the first end cap 215 and the end face 244. The inlet conduit 212 protrudes through the chamber 224, but the volume 226 inside the inlet conduit 212 is separated from the interior of the chamber 224 by the inlet conduit 212 and by the engagement of the inlet conduit 212 with the end face 244. As shown in FIG. 4, an outlet 222 is formed in the interior face 225 of the end cap 215, and this outlet 222 is coupled to the chamber 224 and outlet coupler 221. Thus, the liquid which enters the chamber 224 via the outlets 223 flows into the outlet coupler 221 via the outlet 222, as shown in FIG. 7. The liquid is then output from the accumulator 200 via the outlet coupler 221. The outlet coupler 221, the outlet 222, the chamber 224, outlets 223, the outlet conduit 243, and portions of the second end cap assembly 260 (described in greater detail below) together constitute one example configuration of the outlet portion 120 described above.

In some examples (not illustrated), some of the structures described above as being part of the housing 240 and/or the first end cap 215 may be provided as part of different parts of the accumulator 200. For example, the housing 240 may be split into two separate parts, such as a first part which comprises the inlet 213 and the outlets 223 and a second part which comprises remainder of the housing 240. When assembled, these parts may be coupled together, for example via threading, adhesives, or other fasteners, to form an assembly similar in shape and function to the housing 240. In some examples, the portion of the housing 240 which comprises the inlet 213 and the outlets 223 may instead be incorporated into the end cap 215.

As noted above, the accumulator 200 comprises a folding flexible membrane 250 which defines the liquid channel 253. More specifically, the folding flexible membrane 250 has a tube-like shape with an inlet opening 254 and an outlet opening 255 and an interior liquid channel 251 extending along a longitudinal axis 259 between the inlet and outlet openings 254 and 255. As shown in FIGS. 2-8B, the interior liquid channel 253 is radially surrounded and defined by the flexible membrane 250. As shown by the dashed arrows in FIG. 7, liquid from the inlet 213 of the housing 240 enters the inlet opening 254, flows through the channel 253 along the axial direction, and exits the channel 253 via the outlet opening 255.

Figure 8A:
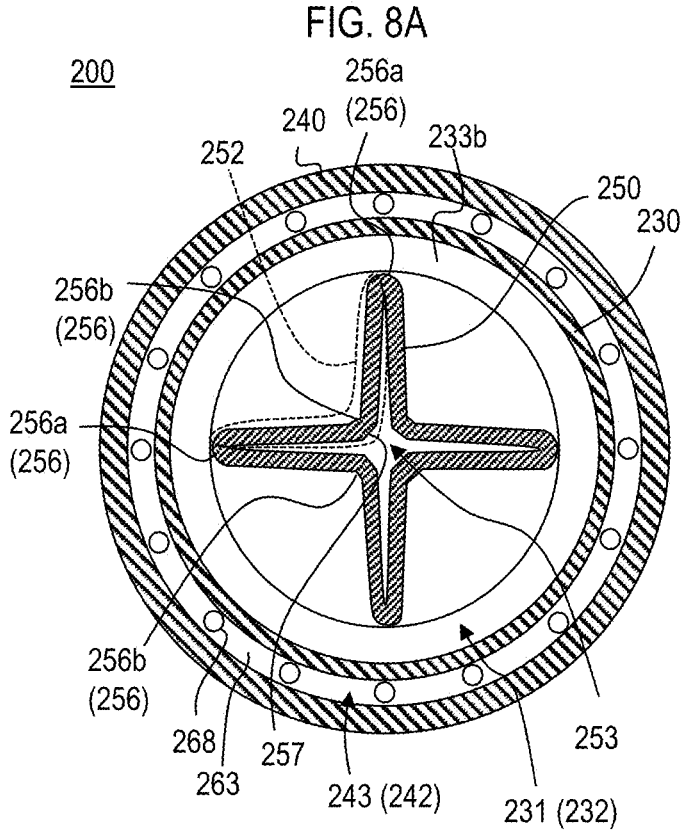
FIG. 8A is a cross-section of the accumulator of FIG. 2 in a resting (neutral) pressure state with the section taken along a plane 8-8 indicated in FIG. 2.

As shown in FIGS. 3 and 8, the membrane 250 comprises a number of folds 256 extending parallel to the axis 259 and distributed circumferentially around the axis 259. The folds 256 alternate in their fold to form a series of folded portions 252, which bound and define the interior liquid channel 253. In particular, as shown in FIG. 8A, the folds 256 comprise first folds 256a and second folds 256b. The first folds 256a are positioned radially farther outward and have an inward fold direction, i.e., the segments adjacent the fold 256a extend in an inward direction (approximately toward axis 259) from the fold 256a. In contrast, the second folds 256b are positioned radially inward and have an outward fold direction, i.e., the segments adjacent the fold 256b extend in an outward direction (approximately away from axis 259) from the fold 256b. The outer folds 256a and inner folds 256b alternate with one another around the circumference of the membrane 250. As indicated by the dashed line in FIG. 8A, each folded portion 252 comprises a portion of the membrane 250 which extends between two first folds 256a, with the folded portion 252 including the one second fold 256b that is located between the two first folds 256a. The folded portions 252 each have a generally V- or U-shaped cross-section (see FIG. 8A). Thus, from a perspective exterior to the membrane, each individual folded portion 252 is shaped like an elongated trough (see FIG. 5), wherein the second fold 256b of the folded portion 252 (the fold that is closer to the axis 259) is the bottom of the trough. From a perspective inside the liquid channel 253, each individual folded portion 252 is shaped like an elongated ridge protruding radially inward toward the axis 259 and extending along the axis 259 (see FIG. 7), wherein the second fold 256b of the folded portion 252 (which is closer to the axis 259) is the crest (top) 257 of the ridge. FIGS. 7 and 8A illustrate the resting state in which the pressure in the liquid chamber 253 is neutral (e.g., at ambient). As can be seen in FIG. 8A, in the resting state, each individual folded portion 252 is shaped like an elongated trough (from a perspective exterior to the membrane) or an elongated ridge (from a perspective inside the liquid channel) extending along the longitudinal axis, with a generally V- or U-shaped cross-section, resulting in a profile in cross-section like a 4-lobed star. In other examples, more than four folded portions 252 may be provided, resulting in the cross-sectional profile having a star-like shape with more points. The lobes or points of the star-like shape may be wider or narrower than that which is illustrated, as desired in the particular implementation (e.g., a material chosen for the membrane 250 may dictate how sharply it can be folded without cracking, and thus in some cases wider lobes/points may be used to allow for smaller fold angles). The folded portions 252 are flexible and thus may deform and change their shape depending on the pressure of the liquid in the interior liquid channel 253. As the pressure in the liquid channel 253 is increased, the folded portions are pushed outward and deformed such that the folds 256 begin to straighten out (unfold). On the other hand, as the pressure in the liquid channel 253 decreases, the air pressure in the air cavity 231 pushes the folded portions 252 back towards their resting state shape.

Figure 8B:
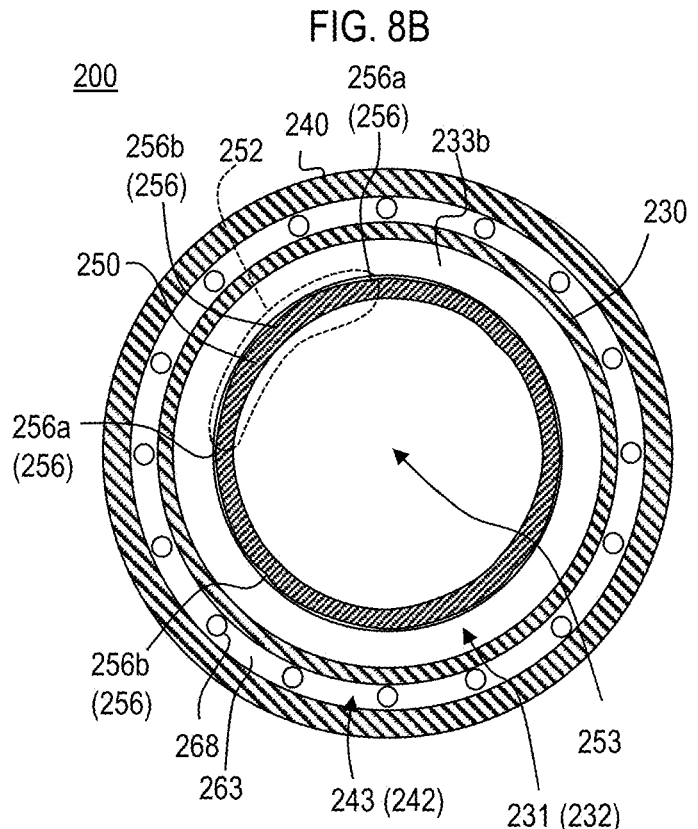
FIG. 8B is a cross-section of the accumulator of FIG. 2 in a high pressure state with the section taken along a plane 8-8 indicated in FIG. 2.

The shape of the membrane 250 at high pressure will differ from the shape of the membrane 250 at the resting state due to the deformation of the folding portions. The ultimate shape of the membrane 250 at the highest rated pressure of the accumulator 200 will depend upon the size of the housing 230 and the material used for the membrane 250, including its properties related to how far it can bend without risk of cracking. As shown in FIG. 8B, in some examples, the folds 256 will almost fully unfold when the pressure in the liquid channel 153 reaches a high pressure threshold (e.g., a maximum rated pressure for the accumulator 200), resulting in the profile of the membrane 250 in cross-section becoming approximately a circle (some jaggedness or bumpiness may remain at the locations of the folds 256). The nearly circular profile may be achieved in cases in which the membrane 250 material is sufficiently flexible and robust so as to avoid cracking or splitting throughout the range of motion and deformation involved. In other examples, to avoid cracking or splitting, the maximum rated pressure for the accumulator 200 may be set to a level lower than the above-described high pressure threshold such that, when the maximum rated pressure is reached, the folds of the membrane 250 have not fully straightened out and the profile in cross-section of the membrane 250 is not circular. The exact shape that is reached at the maximum pressure will vary from one accumulator 200 to the next based on the materials used, the dimensions thereof, and what the maximum pressure is set to. Regardless of what the maximum pressure is set to or what the shape of the membrane 250 is when at the maximum pressure, in each example the membrane 250 is sufficiently flexible to change shape back and forth between the resting state shape and the maximum pressure state shape as the pressure fluctuates in the liquid channel 253.

Figure 5:
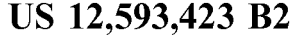
FIG. 5 is another exploded perspective view of the accumulator of FIG. 2.

As shown in FIGS. 3 and 5, the membrane 250 also comprises integrated sealing gaskets 251 which are positioned at opposite ends of the membrane 250 and integrally coupled to the remainder of the membrane 250. Specifically, the gasket 251a is disposed around the inlet opening 254 and the gasket 251b is disposed around outlet opening 255. As shown in FIGS. 4 and 6, in the assembled state, the majority of the membrane 250 is located within the interior volume 232 inside the inner housing 230, but the gaskets 251 protrude out from the interior volume 232 and abut the exterior sides of the end faces 233 of the inner housing 230. Specifically, the gasket 251a abuts the end face 233a, while the gasket 251b abuts the end face 233b. In addition, as shown in FIG. 7, the gasket 251a also abuts the interior side of the end face 244 of the outer housing 240, so that the gasket 251a is clamped between the end face 244 and the end face 233a. Furthermore, as shown in FIG. 7, the gasket 251b also abuts the ledge 269 in the end cap assembly 260 (see also FIG. 6), so that the gasket 251b is clamped between the ledge 269 and the end face 233b.

The gaskets 251 and their engagement with the other structures, as were described above, create air and liquid tight seals which seal off the space that is radially external to the membrane 250 and radially internal to the inner housing 230, thus forming an air-tight cavity 231. This air-tight cavity 231 is filled with a gas, such as air, nitrogen, or any other desired gas, and thus may be referred to herein as an air cavity 231. The air cavity 231 radially surrounds the liquid channel 253, with the membrane 250 (specifically, the folded portions 252 thereof) separating the air cavity 231 from the liquid channel 253. Because the membrane 250 is flexible, the air cavity 231 may be compressed or expanded by deformation of the membrane 250 (e.g., the folded portions 222 may change size and/or shape to allow for this compression or expansion), and such changes in the volume of the air cavity 231 correspond to inverse changes to the volume of the liquid channel 253. The volumes of the air cavity 231 and the liquid channel 253 may reach an equilibrium based on the respective pressures in the air cavity 231 the liquid channel 253. Thus, the air cavity 231 may absorb pressure fluctuations in the liquid loop to which the liquid channel 253 is coupled by expanding or compressing in response to those changes, much like how the bladder in a bladder accumulator expands and contracts in response to pressure changes. However, unlike in a bladder accumulator in which the liquid surrounds the air bladder, in the accumulator 200 the air cavity 231 surrounds the liquid in the liquid channel 253. Moreover, unlike other accumulators in which the liquid chamber is not part of the flow path of fluid through the liquid loop and thus can become stagnant, in the accumulator 200 the liquid channel 253 can be coupled into the fluid flow path and liquid may flow continuously through the liquid channel 253 during usage.

Figure 9:
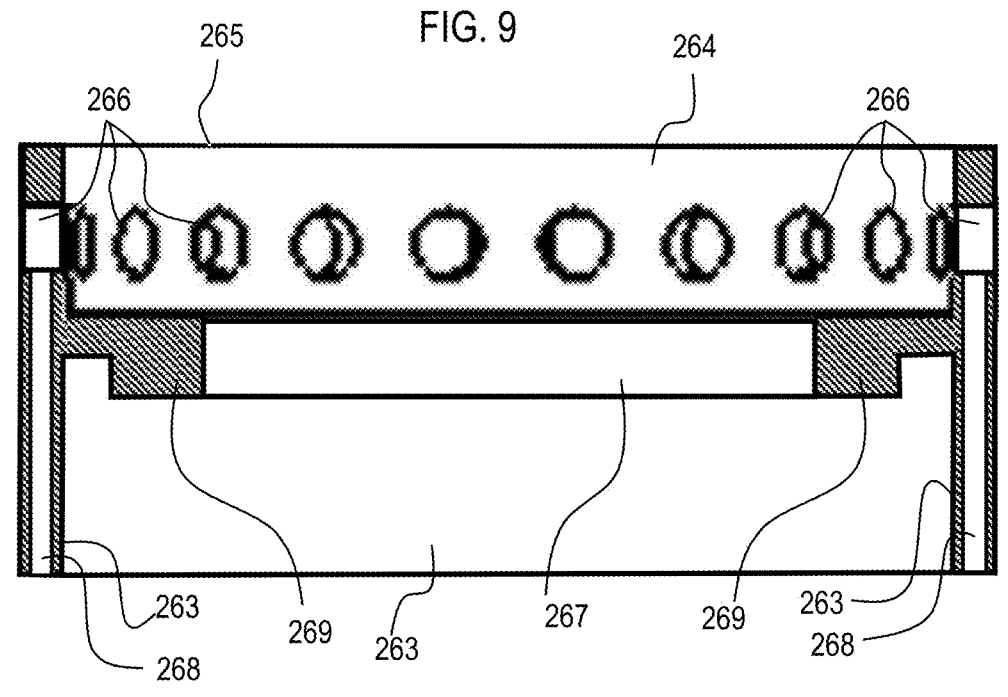
FIG. 9 is a cross-section of a flow diverter of the accumulator of FIG. 2 with the section taken along a plane 7-7 indicated in FIG. 2.
Figure 10:
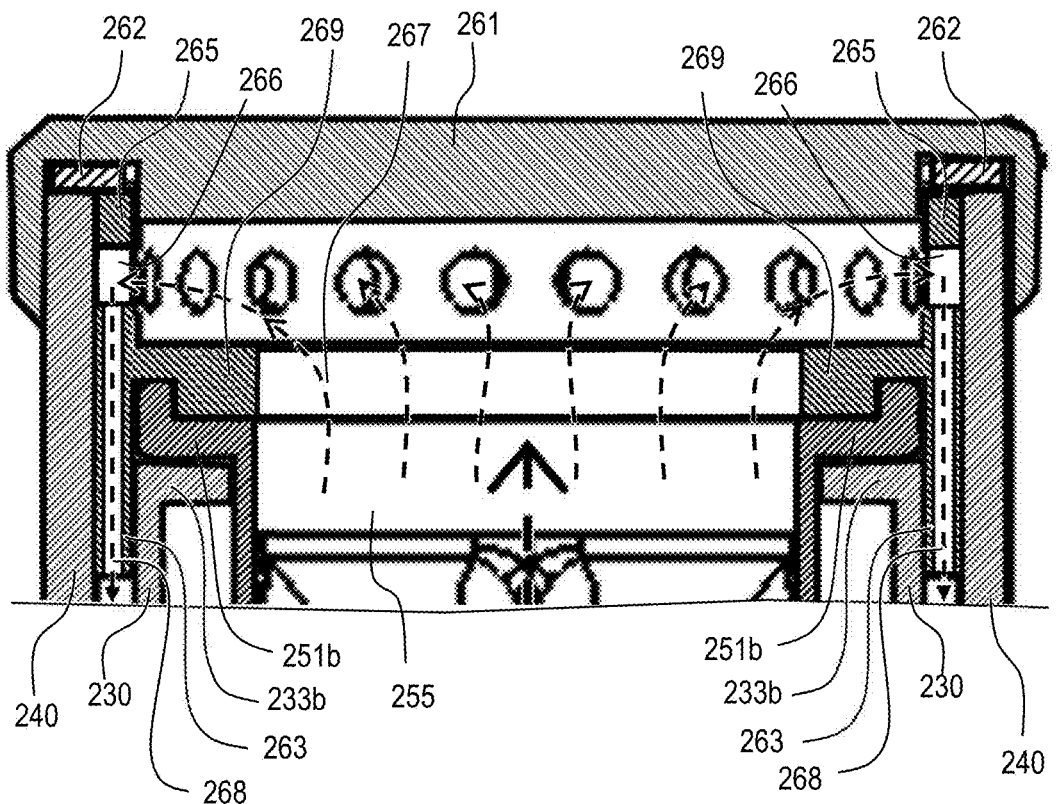
FIG. 10 is an enlarge portion of the cross-section of FIG. 7.

As noted above and as illustrated in FIG. 7, after the liquid exits the liquid channel 253 via the outlet opening 255, it enters and is diverted by the end cap assembly 260. As shown in FIGS. 3 and 5, the end cap assembly 260 comprises a cap portion 261, a flow redirection portion 265, and a gasket 262 disposed therebetween. As shown in FIGS. 4 and 6, the cap portion 261 is coupled to the flow redirection portion 265 (with the gasket 262 disposed therebetween) (see also FIG. 10). Moreover, as shown in FIGS. 5 and 9, the flow redirection portion 265 has the shape of a hollow cylinder, with an annular ledge 269 disposed in the interior thereof. As shown in FIG. 10, flow redirection portion 265 is positioned within the outer housing 240 and the outer surface of the flow redirection portion 265 abuts the inner surface of the outer housing 240. As shown in FIG. 10, the cap portion 261 is attached to the outer housing 240 with the end of the outer housing 240 received within a rim of the cap portion 261. For example, threads, adhesives, mechanical fasteners, welding, or any other fastening technique may be used to attach the cap portion 261 to the outer housing 240.

As shown in FIG. 9, the cylindrical walls of the flow redirection portion 265 include proximal cylindrical wall portion 263 extending from one side of the ledge 269 and distal cylindrical wall portion 264 extending from the other side of the ledge 269. As shown in FIG. 10, the proximal cylindrical wall portion 263 is positioned in between and abutting both of the inner housing 230 and the outer housing 240. In addition, the shelf 269 abuts the gaskets 251b of the membrane 250. The cap portion 261 abuts the flow redirection portion 265 and pushes the flow redirection portion 265 against the membrane 250, thus clamping the gasket 251b between the end face 233b and the shelf 269. The cylindrical wall portion 263 of the flow redirection portion 265 include multiple internal conduits 268 comprising bores extending parallel to the longitudinal axis of the accumulator 200, as shown in FIG. 9, with the conduits 268 arranged circumferentially around the portion 265, as shown in FIG. 5. The distal cylindrical wall portion 264 comprises openings 266 arranged circumferentially around the portion 265, as shown in FIG. 5, and these openings 266 connect the interior volume of the portion 265 to the conduits 268. The ledge 269 has an opening 268. As shown in FIGS. 7 and 9, the opening 268 is fluidically coupled to the outlet opening 255 of the membrane 250. Thus, as shown by the dashed arrows in FIG.

10, as liquid exits the liquid channel 253 via the outlet opening 255 (moving generally towards the cap 261), the liquid enters the flow redirecting portion 265 via the opening 267, passes thorough the openings 266 into the conduits 268, and flows along the conduits 268 away from the cap 261. As shown in FIG. 7, the conduits 268 are coupled to the outlet conduit 243, and thus after the liquid exits the conduits 268 it continues to flow along the outlet conduits 243 towards the first end cap 215, ultimately exiting the accumulator 200 via the volume 224 and the outlet coupler 221 as described previously.

Turning now to FIGS. 11-16, another example flow-through folding membrane accumulator 300 will be described. The accumulator 300 is one example configuration of the accumulator 100. Thus, some components of the accumulator 300 correspond to (i.e., are the same as, similar to, and/or example configurations of) components of the accumulator 100 described above. The components of the accumulator 300 and the components of the accumulator 100 which correspond to one another are given reference numbers with the same last two digits, such as 150 and 350. The descriptions above of the components of the accumulator 100 are applicable to the corresponding components of the accumulator 300 (unless otherwise indicated or logically contradictory), and thus duplicative descriptions of some aspects already described above are omitted below.

FIGS. 11-16 show the accumulator 300 in various perspectives and in various states, and aspects of the accumulator 300 may be visible in multiple of the figures. The description below will refer to the figures as and when they are relevant to the aspect being described, rather than in strict numerical order.

The accumulator 300 differs from the accumulator 200 described above primarily in that the accumulator 300 has an inlet coupler 311 and an outlet coupler 321 that are coupled to opposite sides of the accumulator 300, instead of being coupled to the same side thereof as was the case in the accumulator 200. Consequently, the outlet conduits and other structures described above which redirected the outlet liquid back towards the inlet side can be omitted in the accumulator 200.

Figure 11:
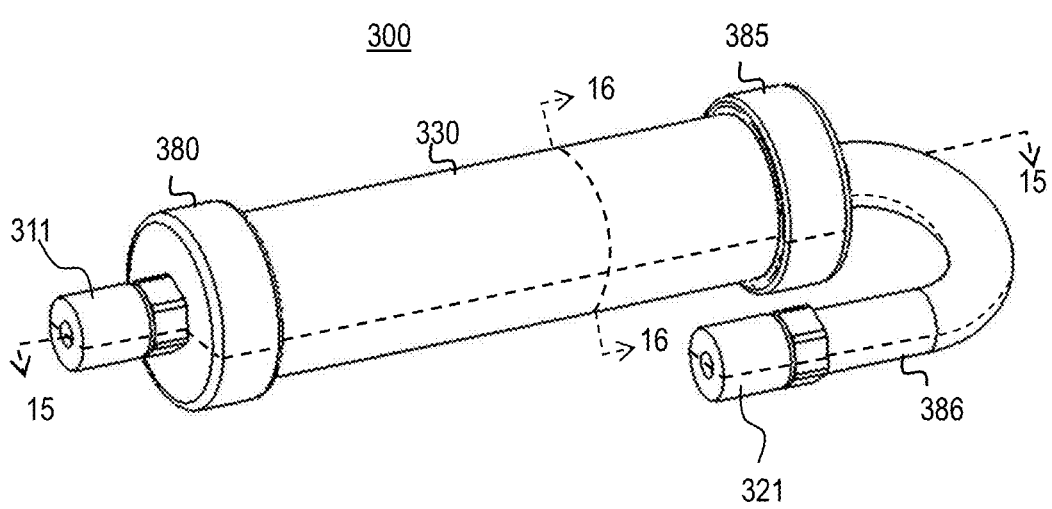
FIG. 11 is a perspective view of another example flow-through folding membrane accumulator having inlet and outlet couplings disposed on opposite ends.
Figure 12:
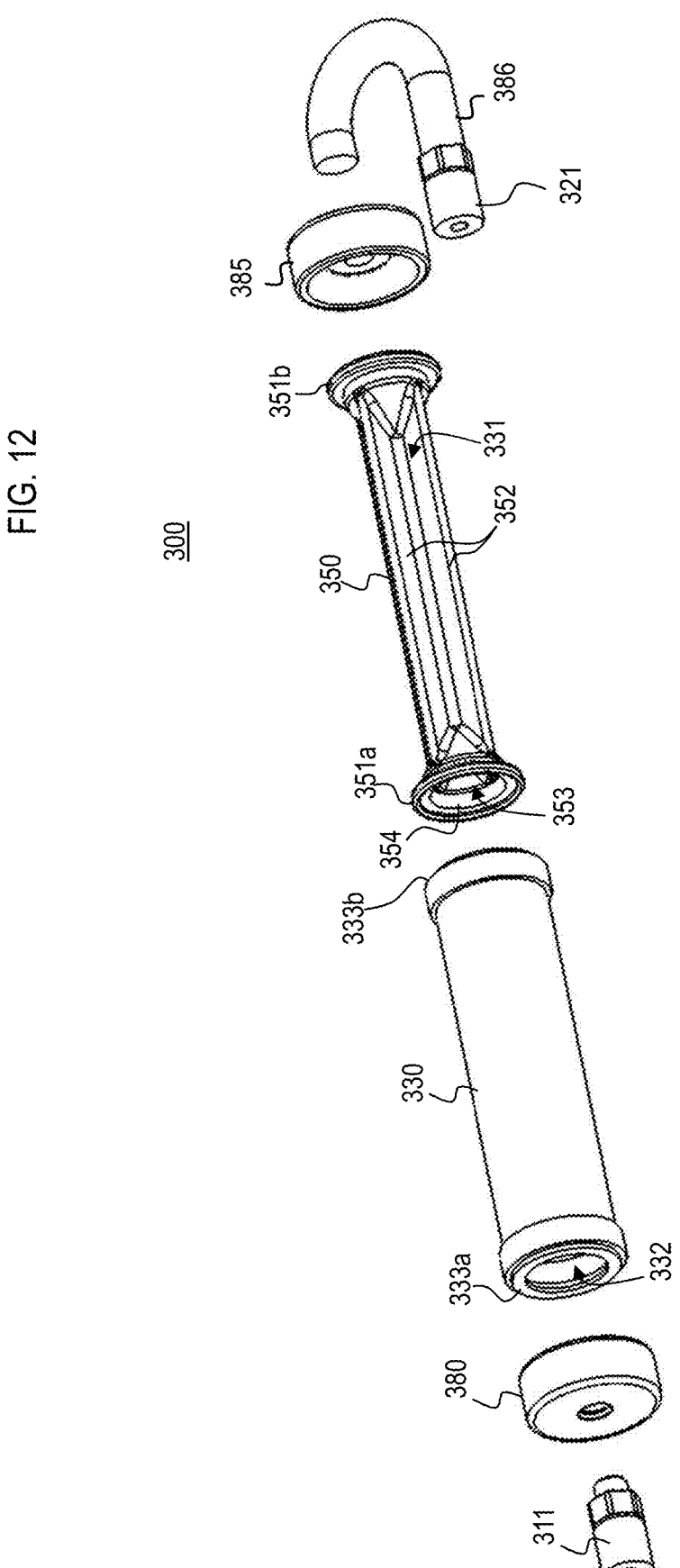
FIG. 12 is an exploded perspective view of the accumulator of FIG. 11.

As shown FIG. 11, the accumulator 300 comprises a housing 330, a first end cap 380, an inlet coupler 311, an outlet coupler 321, and a second end cap 385. The housing 330 may be similar to the inner housing 230 described above. As shown in FIG. 12, the accumulator 300 also comprises a folding flexible membrane 350. The folding flexible membrane 350 may be similar to the membrane 250 described above. As shown in FIGS. 12-16, the membrane 350 is disposed within an interior volume 332 of the housing 330. The end caps 380 and 385 are coupled to opposite ends of the housing 330 (e.g., via threads, adhesives, or any other fastening technique) and they seal the housing 330 relative to an external environment in a water-tight manner, except for openings in the inlet coupler 311 and outlet coupler 321. The inner housing 330 is one configuration of the housing 130 described above. The folding flexible membrane 350 is one configuration of the folding flexible membrane 150 described above.

As shown in FIG. 11, in the illustrated example, the inlet coupler 311 and the outlet coupler 321 are coupled to opposite end caps, namely the first end cap 380 and second end cap 385, respectively. The outlet coupler 321 is coupled to the end cap 385 via the flexible tube 386 in the illustrated example, but in other examples, the outlet coupler 321 may be coupled directly to the end cap 385. The inlet coupler 311 and the outlet coupler 321 comprise QD fluid couplers in one example. In other examples, any other type of fluid couplers may be used.

As shown in FIG. 12, the folding flexible membrane 350 has a tube-like shape with an inlet opening 354 and an outlet opening 355 (see FIG. 14) and an interior liquid channel 351 extending along a longitudinal axis 359 between the inlet and outlet openings 354 and 355. As shown in FIGS. 12-16, the interior liquid channel 353 is radially surrounded and defined by the flexible membrane 350. As shown by the dashed arrows in FIG. 15, liquid from the inlet coupler 311 of the housing 340 enters the inlet opening 354, flows through the channel 353 along the axial direction, exits the channel 353 via the outlet opening 355, flows through the flexible tube 386 (if one is present), and then flows out the outlet coupler 321.

Figure 15:
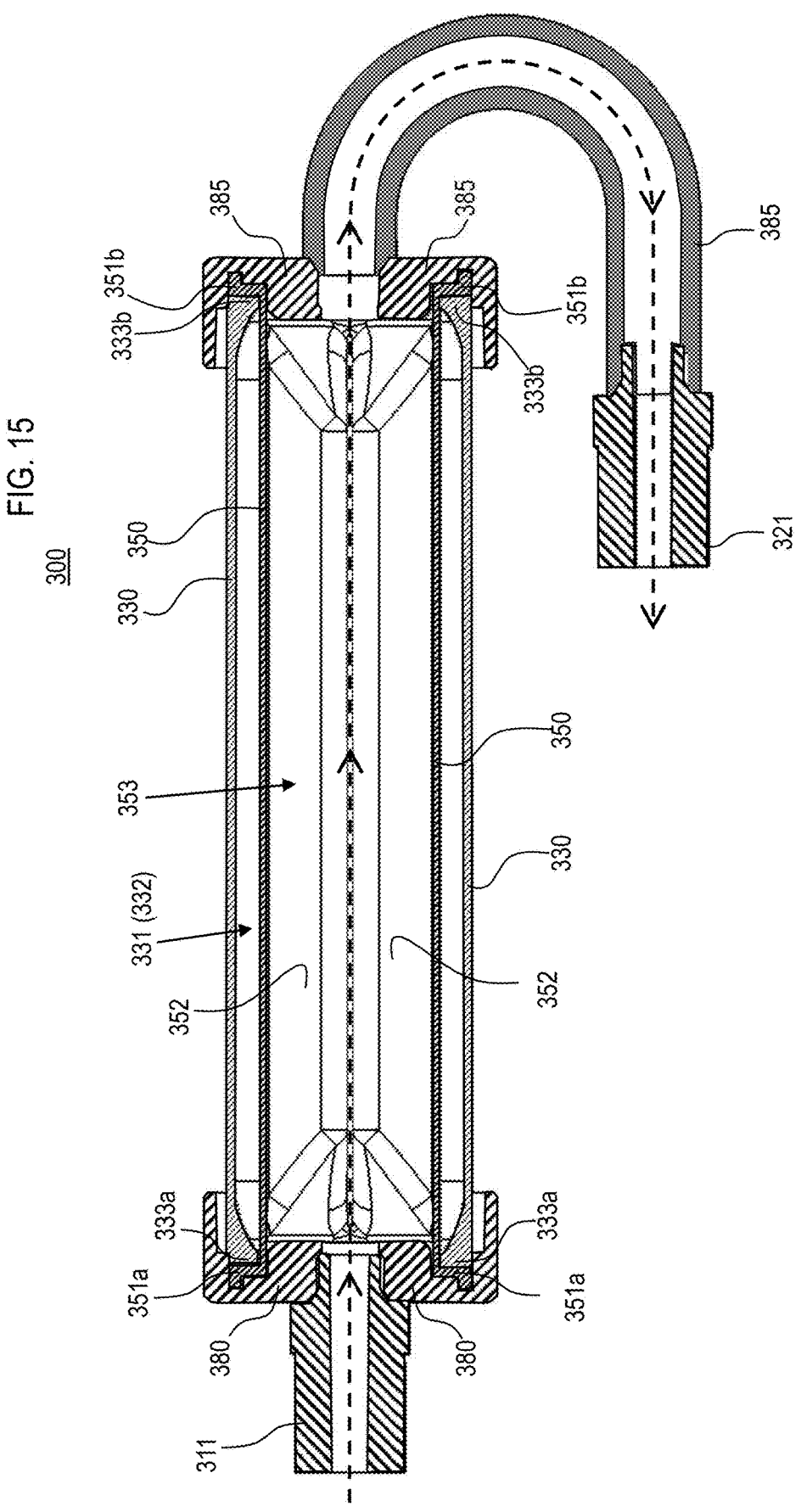
FIG. 15 is a cross-section of the accumulator of FIG. 11 with the section taken along a plane 15-15 indicated in FIG. 11.
Figure 16:
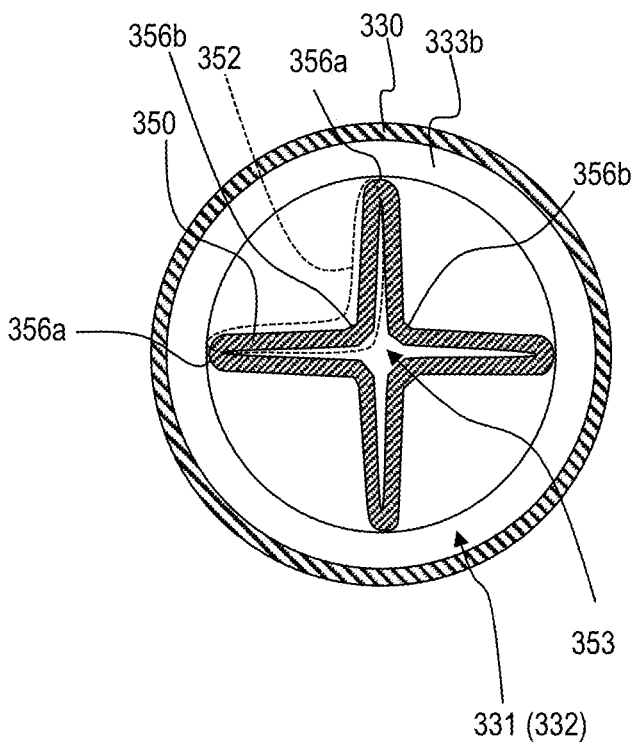
FIG. 16 is a cross-section of the accumulator of FIG. 11 with the section taken along a plane 16-16 indicated in FIG. 11.

As shown in FIGS. 12 and 16, the membrane 350 comprises a number of folds 356 extending parallel to the axis 359 and distributed circumferentially around the axis 359. The folds 359 alternate in direction to form a series of folded portions 352, which bound and define the interior liquid channel 353, with folds 356a folding one direction and folds 356b folding the opposite direction (only some of the folds 356 are labeled). These fold portions 352 are similar to the fold portions 252 described above. FIGS. 15 and 16 illustrate the resting state in which the pressure in the liquid chamber 353 is neutral (e.g., at ambient). As can be seen in FIG. 16, in the resting state, each individual folded portion 352 is shaped like an elongated trough (from a perspective exterior to the membrane) or an elongated ridge (from a perspective inside the liquid channel) extending along the longitudinal axis, with a generally V- or U-shaped cross-section, resulting in a profile in cross-section like a 4-lobed star. In other examples, more than four folded portions 352 may be provided, resulting in the cross-sectional profile having a star-like shape with more points. The lobes or points of the star-like shape may be wider or narrower than that which is illustrated, as desired in the particular implementation (e.g., a material chosen for the membrane 350 may dictate how sharply it can be folded without cracking, and thus in some cases wider lobes/points may be used to allow for smaller fold angles). The folded portions 352 are flexible and thus may deform and change their shape depending on the pressure of the liquid in the interior liquid channel 353. As the pressure in the liquid channel 353 is increased, the folded portions are pushed outward and deformed such that the folds 356 begin to straighten out (unfold). On the other hand, as the pressure in the liquid channel 353 decreases, the air pressure in the air cavity 331 pushes the folded portions 352 back towards their resting state shape.

The shape of the membrane 350 at high pressure will differ from the shape of the membrane 350 at the resting state due to the deformation of the folding portions. The ultimate shape of the membrane 350 at the highest rated pressure of the accumulator 300 will depend upon the size of the housing 330 and the material used for the membrane 350, including its properties related to how far it can bend without risk of cracking. In some examples, the folds 356 will almost fully unfold when the pressure in the liquid channel 353 reaches a high pressure threshold (e.g., a maximum rated pressure for the accumulator 300), resulting in the profile of the membrane 350 in cross-section becoming approximately a circle (some jaggedness or bumpiness may remain at the locations of the folds) (e.g., see the shape of the membrane 250 illustrated in FIG. 8B). The nearly circular profile may be achieved in cases in which the membrane 350 material is sufficiently flexible and robust so as to avoid cracking or splitting throughout the range of motion and deformation involved. In other examples, to avoid cracking or splitting, the maximum rated pressure for the accumulator 300 may be set to a level lower than the above-described high pressure threshold such that, when the maximum rated pressure is reached, the folds of the membrane 350 have not fully straightened out and the profile in cross-section of the membrane 350 is not circular. The exact shape that is reached at the maximum pressure will vary from one accumulator 300 to the next based on the materials used, the dimensions thereof, and what the maximum pressure is set to. Regardless of what the maximum pressure is set to or what the shape of the membrane 350 is when at the maximum pressure, in each example the membrane 350 is sufficiently flexible to change shape back and forth between the resting state shape and the maximum pressure state shape as the pressure fluctuates in the liquid channel 353.

Figure 13:
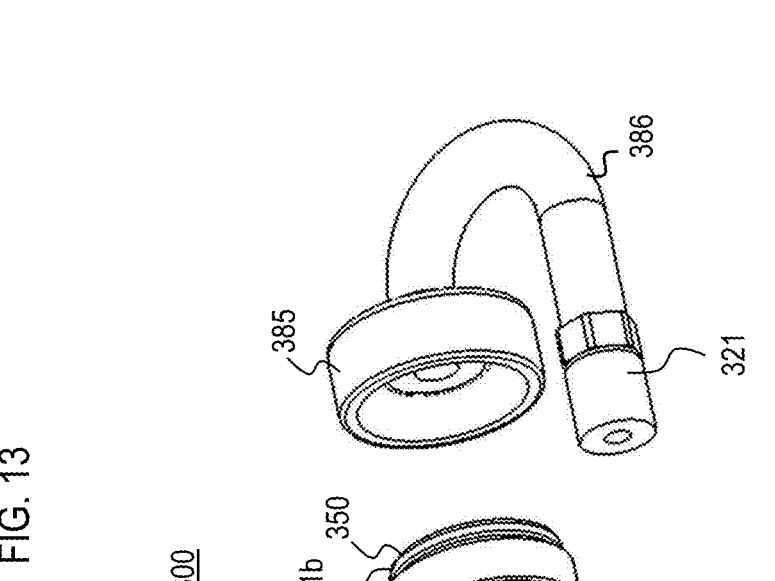
FIG. 13 is a partially exploded perspective view of the accumulator of FIG. 11.
Figure 13:
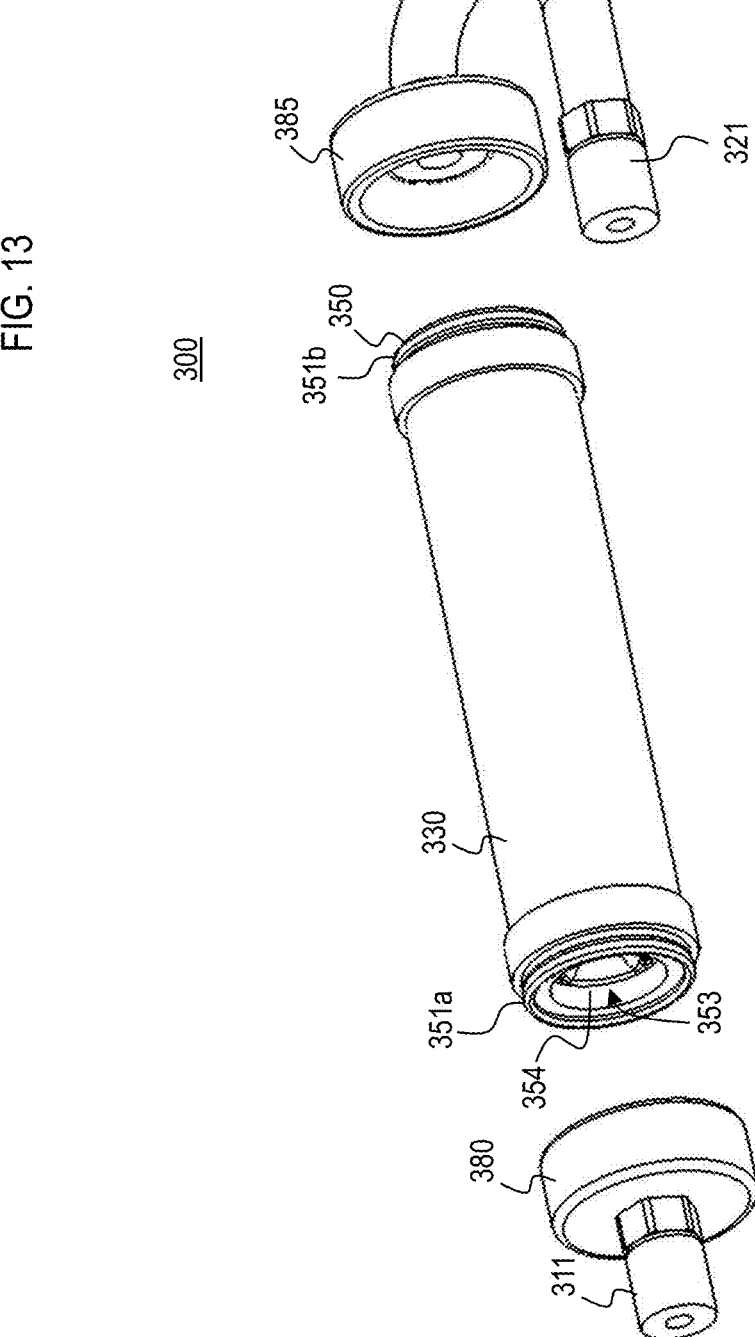
Figure 14:
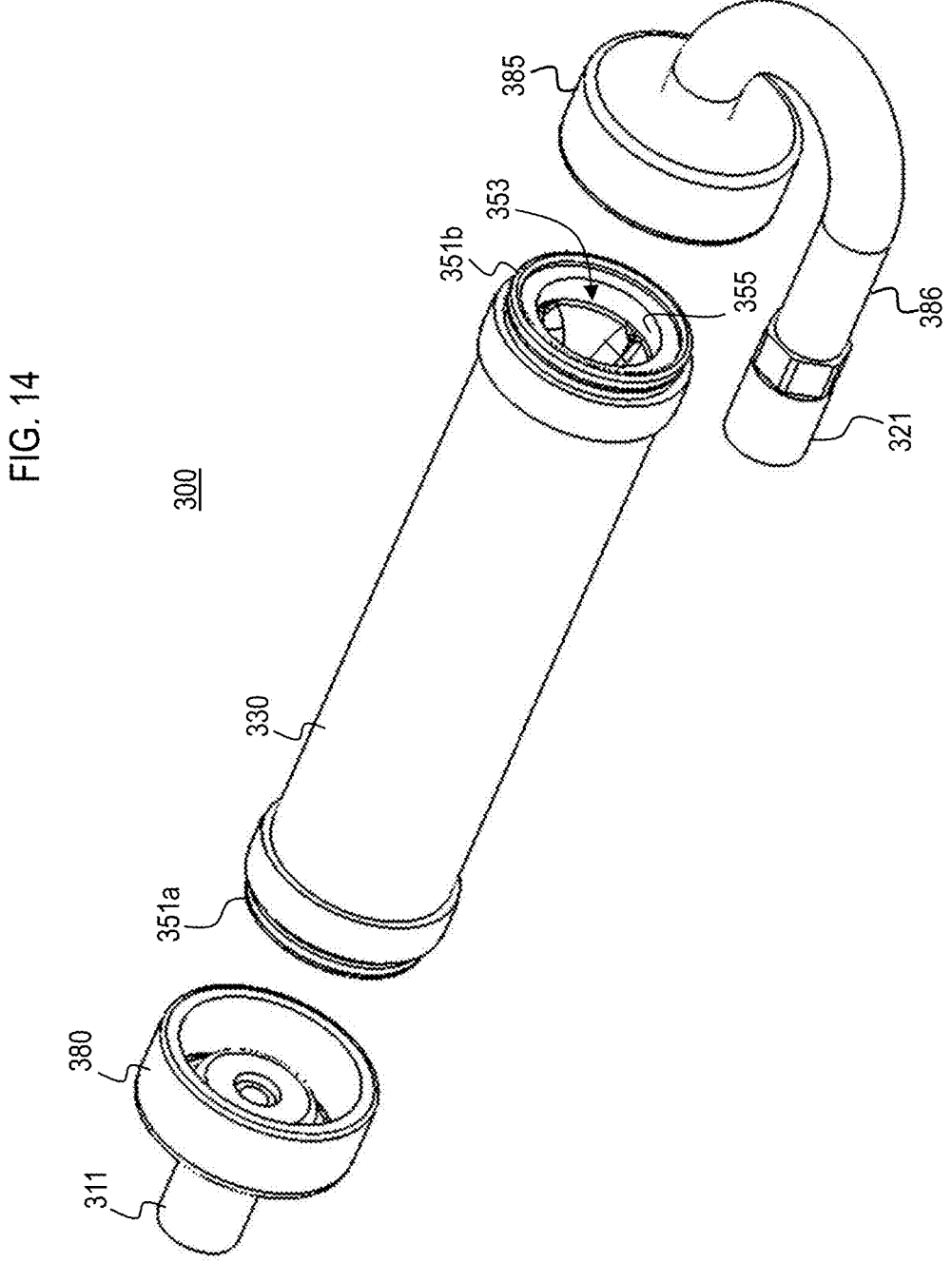
FIG. 14 is another partially exploded perspective view of the accumulator of FIG. 11.

As shown in FIGS. 12-15, the membrane 350 also comprises integrated sealing gaskets 351 which are integrally coupled to opposite ends of the membrane 350. Specifically, the gasket 351a is disposed around the inlet opening 354 and the gasket 351b is disposed around outlet opening 355. As shown in FIGS. 13 and 14, in the assembled state, the majority of the membrane 350 is located within the interior volume 332 inside the housing 330, but the gaskets 351 protrude out from the interior volume 332 and abut the exterior sides of the end faces 333 of the inner housing 330. Specifically, the gasket 351a abuts the end face 333a, while the gasket 351b abuts the end face 333b. In addition, as shown in FIG. 15, the gasket 351a also abuts the interior side of the end cap 380, so that the gasket 351a is clamped between the end cap 380 and the end face 333a. Furthermore, as shown in FIG. 15, the gasket 351b also abuts the ledge end cap 385, so that the gasket 351b is clamped between the end cap 385 and the end face 333b.

The gaskets 351 and their interactions with the other structures mentioned above create air and liquid tight seals which seal off the space that is radially external to the membrane 350 and radially internal to the housing 330, thus forming an air-tight cavity 331. This air-tight cavity 331 is filled with a gas, such as air, nitrogen, or any other desired gas, and thus may be referred to herein as an air cavity 331. The air cavity 331 radially surrounds the liquid channel 353, with the membrane 350 (specifically, the folded portions 352 thereof) separating the air cavity 331 from the liquid channel 353. Because the membrane 350 is flexible, the air cavity 331 may be compressed or expanded by deformation of the membrane 350 (e.g., the folded portions 322 may change size and/or shape to allow for this compression or expansion), and such changes in the volume of the air cavity 331 correspond to inverse changes to the volume of the liquid channel 353. The volumes of the air cavity 331 and the liquid channel 353 may reach an equilibrium based on the respective pressures in the air cavity 331 the liquid channel 353. Thus, the air cavity 331 may absorb pressure fluctuations in the liquid loop to which the liquid channel 353 is coupled by expanding or compressing in response to those changes, much like how the bladder in a bladder accumulator expands and contracts in response to pressure changes. However, unlike in a bladder accumulator in which the liquid surrounds the air bladder, in the accumulator 300 the air cavity 331 surrounds the liquid in the liquid channel 353. Moreover, unlike other accumulators in which the liquid chamber is not part of the flow path of fluid through the liquid loop and thus can become stagnant, in the accumulator 300 the liquid channel 353 can be coupled into the fluid flow path and liquid may flow continuously through the liquid channel 353 during usage.

Turning now to FIGS. 17-20, example systems that can utilize the accumulators described above are described.

Figure 17:
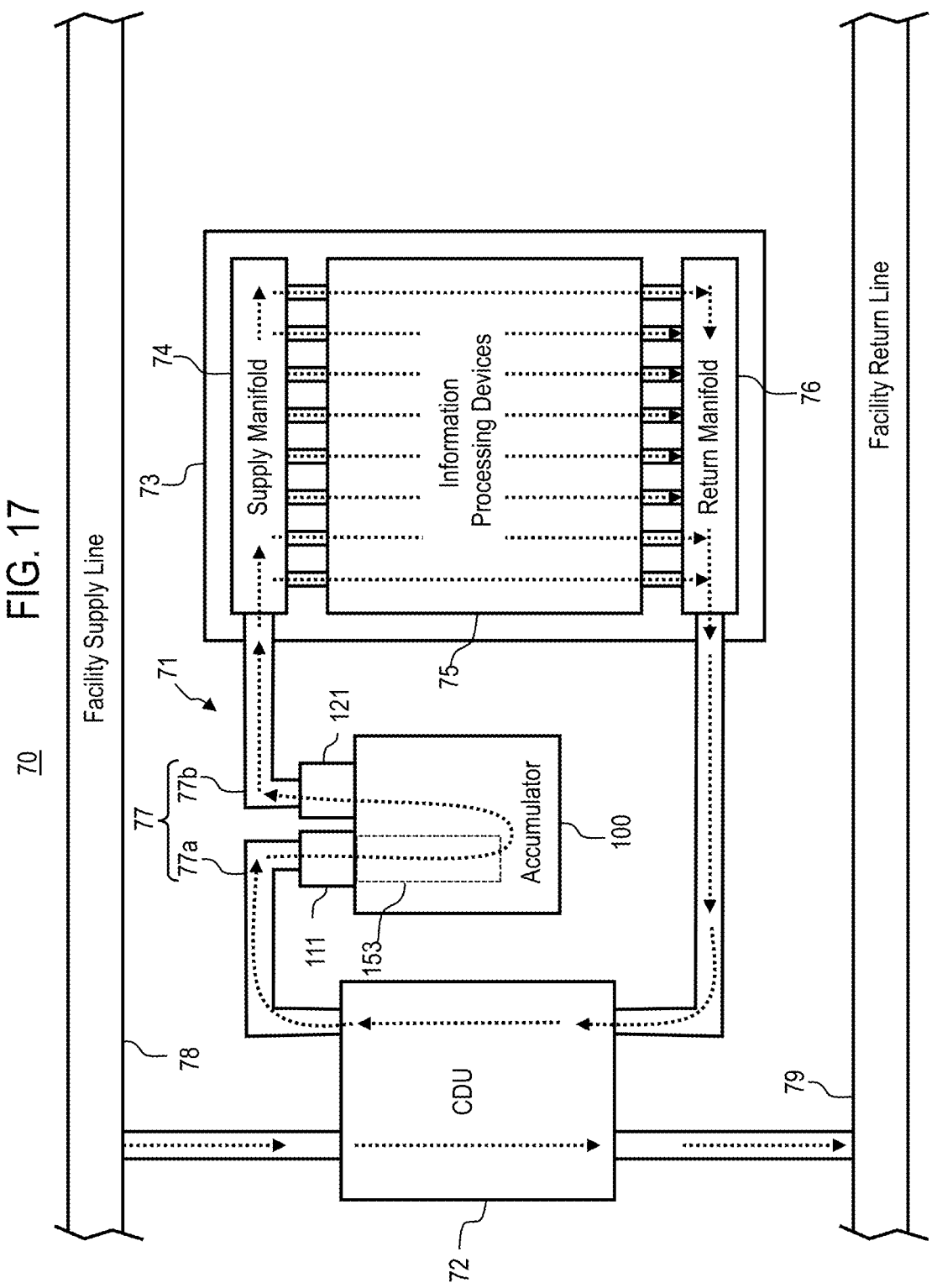
FIG. 17 is a block diagram schematically illustrating an example information processing system with liquid cooling loop having a flow-through folding membrane accumulator.

As shown in FIG. 17, the system 70 comprises an information processing system 73, which comprises one or more information processing devices 75. The information processing devices 75 may include, for example, computers (e.g., servers), networking devices (e.g., switches), or any other information processing devices. In some examples, the information processing system 73 comprises multiple such information processing devices 75 arranged in a rack, cabinet, system housing, or other support structure.

The system 70 also comprises a liquid cooling system 71. The liquid cooling system 71 is arranged to provide liquid coolant to the information processing devices 75 to remove heat therefrom via pipes, manifolds 74 and 76, fittings, and/or other liquid cooling infrastructure which forms a liquid cooling loop. The liquid coolant may be water or any other desired liquid coolant. The liquid cooling system 71 may comprise a coolant distribution unit (CDU) 72 which has a pump to drive the liquid coolant to circulate in a loop from the CDU 72 to the information processing system 73 and then back again to the CDU 72, as indicated by the dotted-line arrows in FIG. 17. The CDU 72 supplies cooled liquid to the information processing devices 75 via supply side piping 77 and, in some cases, a supply manifold 74. The supply side piping 77 comprises one or more pipes, tubes, or other conduits forming one or more liquid flow paths from the CDU 72 to the devices 75. In examples in which the liquid cooling system 71 uses direct-liquid cooling, the supply manifold 74 may distribute the coolant among the multiple information processing devices 75, with the coolant absorbing heat via cold plates (not visible) thermally coupled to the information processing devices. In other examples, supply manifold 74 is omitted. For example, the liquid cooling system 71 may be a hybrid air/liquid cooling system in which air is used to directly cool some or all components of the system 73 and then the liquid coolant of the system 71 is used to extract the heat from this air via an air-to-liquid heat exchanger local to the system 75, in which case the liquid coolant may be supplied to this heat exchanger in addition to or instead of being supplied directly to each individual information processing device. After absorbing the heat from the information processing system 73 (whether directly or via an intermediary such as a heat exchanger), the heated coolant is returned to the CDU 72, for example via a return manifold 76 or other conduits. The CDU 72 may comprise a liquid-to-liquid heat exchanger which may transfer heat from the heated coolant of the system 71 into a separate facility liquid cooling loop. The facility cooling loop may, for example, have a facility supply line 78 to supply facility coolant to the CDU 72 and a facility return line 79 to receive heated coolant from the CDU 72. In some examples, the coolant loop of the system 71 is a closed loop, and the coolant in the system 71 does not mix with the facility coolant.

In addition to the infrastructure described above, the liquid cooling system 71 comprises one or more of the accumulators 100 described above, which may include the accumulators 200 or 300. In FIG. 17, one accumulator 100 is connected to the supply side piping 77 of the liquid cooling loop. In other examples, the accumulator 100 may be connected to some other portion of the liquid cooling loop, such as to a return side conduit which returns heated liquid to the CDU 72. The accumulator 100 has its inlet coupling 111 coupled to a first portion 77a of the supply side piping 77 while the outlet coupling 121 is coupled to a second portion 77*b* of the supply side piping 77 which is downstream of the portion 77*a*. Thus, liquid flowing through the supply side piping 77 from the CDU to the system 75 passes through the accumulator 100. The accumulator 100 is a flow-through accumulator, as described above, and thus the liquid continuously flows through the internal liquid channel 153 of the accumulator 100 as it is recirculated through the liquid cooling loop. In some examples, the accumulators 100 or the conduits 77*a* and/or 77*b* could be fitted with check valves, to ensure flow moves only in one direction through the accumulator and the overall system.

Figure 18:
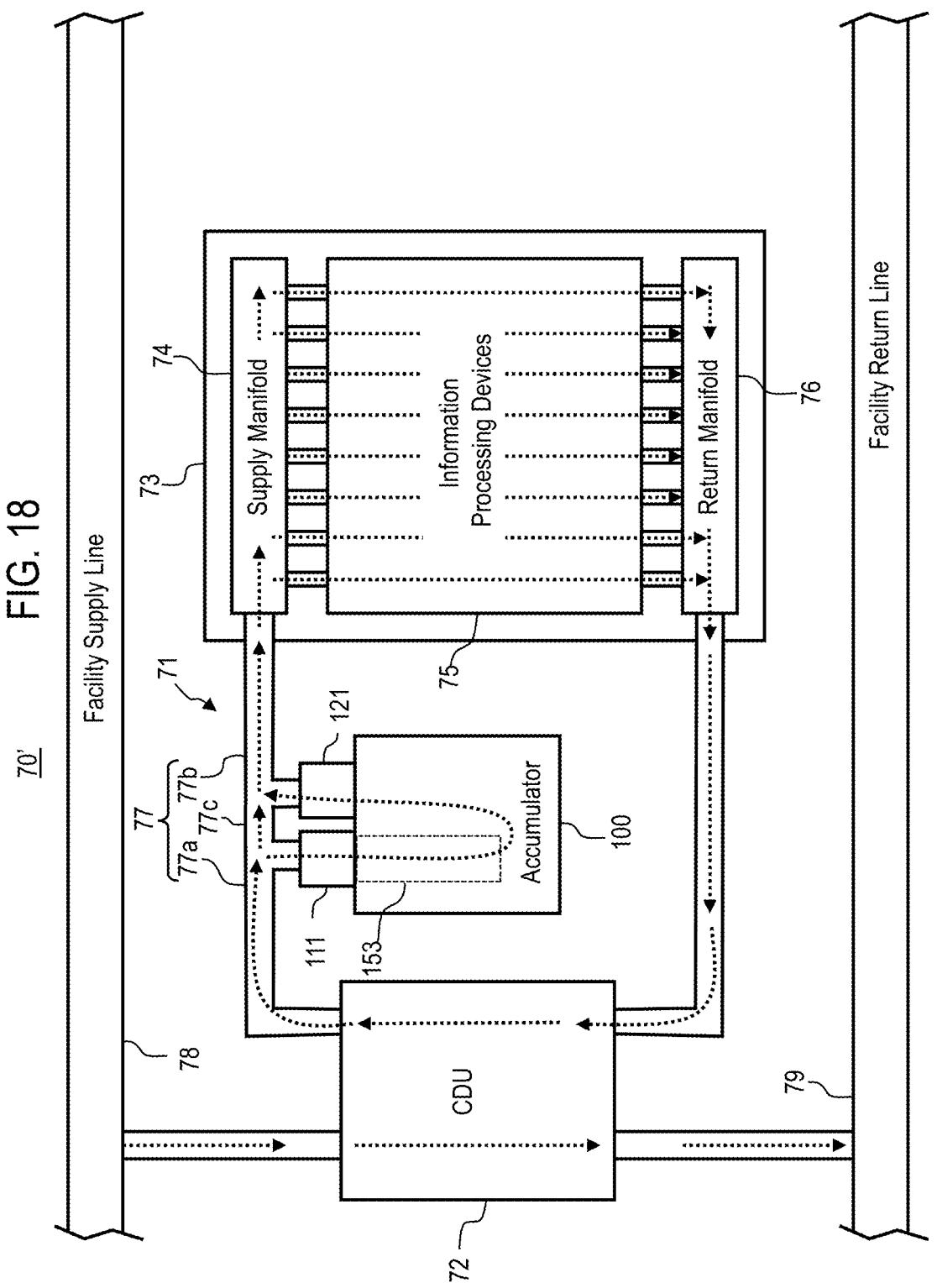
FIG. 18 is a block diagram schematically illustrating another example information processing system with liquid cooling loop having a flow-through folding membrane accumulator.

In the example of FIG. 17, the accumulator 100 is provided in series with the portions 77*a* and 77*b* and no other alternative routes are provided for the liquid to bypass the accumulator 100. Thus, all of the liquid flowing through supply side piping 77 passes through the accumulator 100. However, this need not necessarily be the case. For example, FIG. 18 illustrates the system 70', which is the same as the system 70 except that the portions 77*a* and 77*b* of the supply side piping 77 are fluidically connected together by another portion 77*c* of the supply side piping 77, in addition to being connected together via the accumulator 100. In other words, the portion 77*c* and the accumulator 100 are arranged in parallel between the portions 77*a* and 77*b*. Thus, in this example, some of the liquid flowing through the supply side piping 77 will flow through the portion 77*c* and bypass the accumulator 100. However, a portion of the flow will also split off and flow through the accumulator 100, as illustrated. Although only a portion of liquid coolant flows through the accumulator, the flow is continuous and flows fully through the internal liquid channel 153, and therefore flow is sufficient to avoid stagnant liquid in the accumulator 100.

In some examples, the accumulators 100 or the conduits 77*a*, 77*b*, and/or 77*c* could be fitted with check valves. By putting a check valve on one or both of the openings of an accumulator 100, or series of accumulators 100, when the openings thereof are connected in parallel to a system, such as FIG. 18 or in FIG. 19, the check valves ensures fluid enters the accumulator/s on one end, and exits from the other end, thus preventing fluid from exiting back out the same opening from which it entered (such as during a momentary pressure spike), and preventing stagnant flow from developing within the accumulator 100.

In some examples, the conduit portion 77*c* may comprise a feature of the supply side conduit that creates a pressure drop, such as a flow restricting orifice or a valve (e.g., an adjustable metering valve or flow control valve, whether manual or electronically controlled). Such a feature may be provided to adjust flow volumes through various parts of the loop (e.g., adjust the among of flow which is diverted through the accumulator 110), help to control the total pressure drop imparted by the accumulator 100 on the overall system, or some other function. When such a pressure dropping feature is present, by arranging the accumulator 100 in parallel to this pressure drop feature the overall flow of the piping 77 may be improved and the pressure drop from the feature may be mitigated. If a check valve were paired with a flow restriction device in 77*c*, this could also help prevent local recirculating flow from developing.

Figure 19:
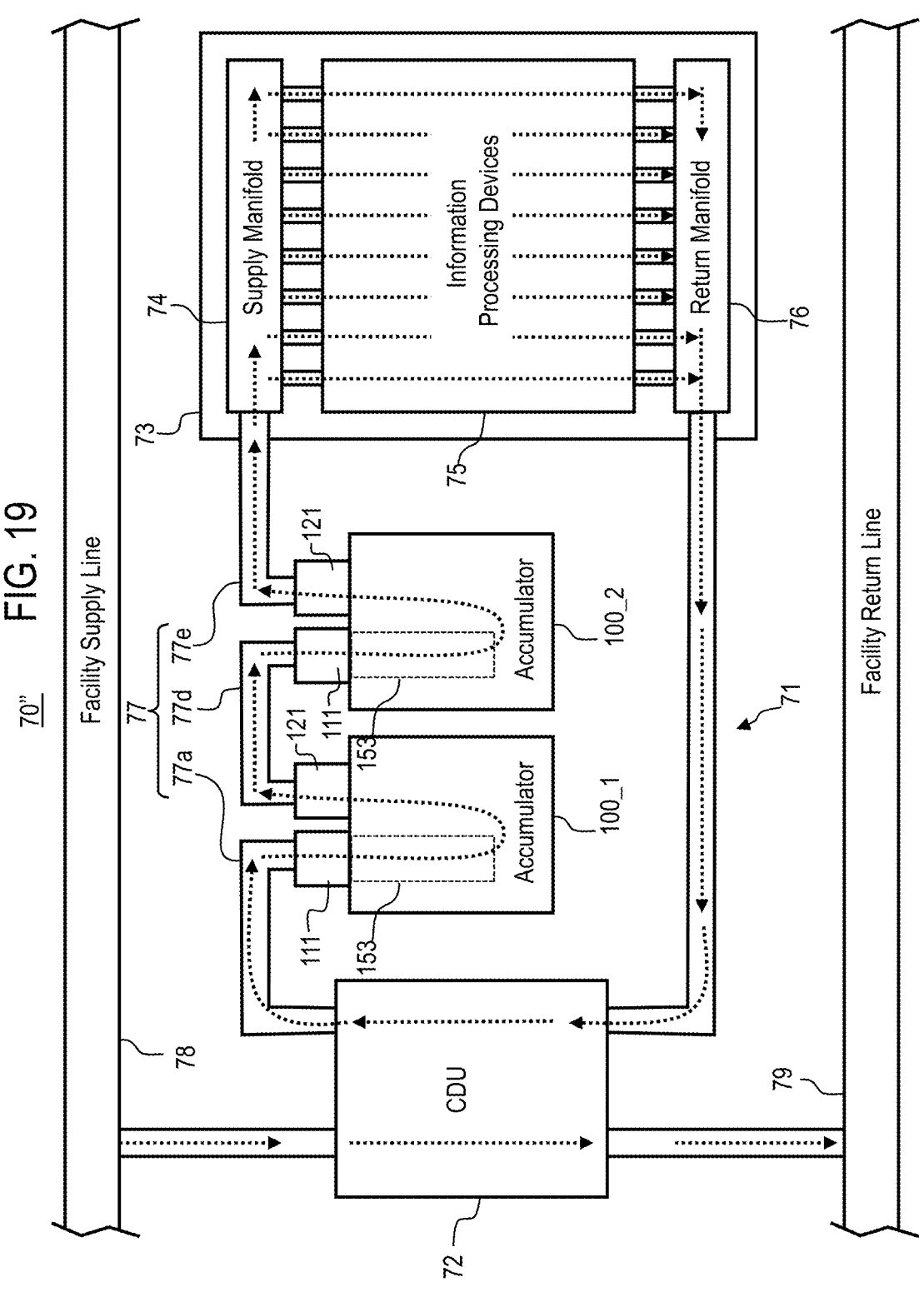
FIG. 19 is a block diagram schematically illustrating another example information processing system with liquid cooling loop having two flow-through folding membrane accumulators in series.

In other examples, multiple accumulators 100 may be used. For example, FIG. 19 illustrates the system 70", which is the same as the system 70 except that two accumulators 100 are coupled into the supply side piping 77. In this example, the accumulators 100 are arranged in series with one another. That is, the outlet coupler 121 of the accumulator 100_1 is coupled to the inlet coupler 111 of the accumulator 100_2 (via conduit portion 77*d*). Thus, liquid flows through both accumulators 110 in series. Although not illustrated, in some examples the piping 77 may also comprise one or more parallel bypassing paths, which may couple various portions of the piping 77 together to form an alternate fluid flow path, similar to how the portion 77*c* connected the portions 77*a* and 77*b* in the example of FIG. 18. For example, a bypass may connect portion 77*a* to portion 77*d*, a bypass may connect portion 77*d* to portion 77*e*, and/or a bypass may connect portion 77*a* to portion 77*e*. In some examples, the accumulators 100 or the conduits 77*a*, 77*d*, and/or 77*e* could be fitted with check valves.

Figure 20:
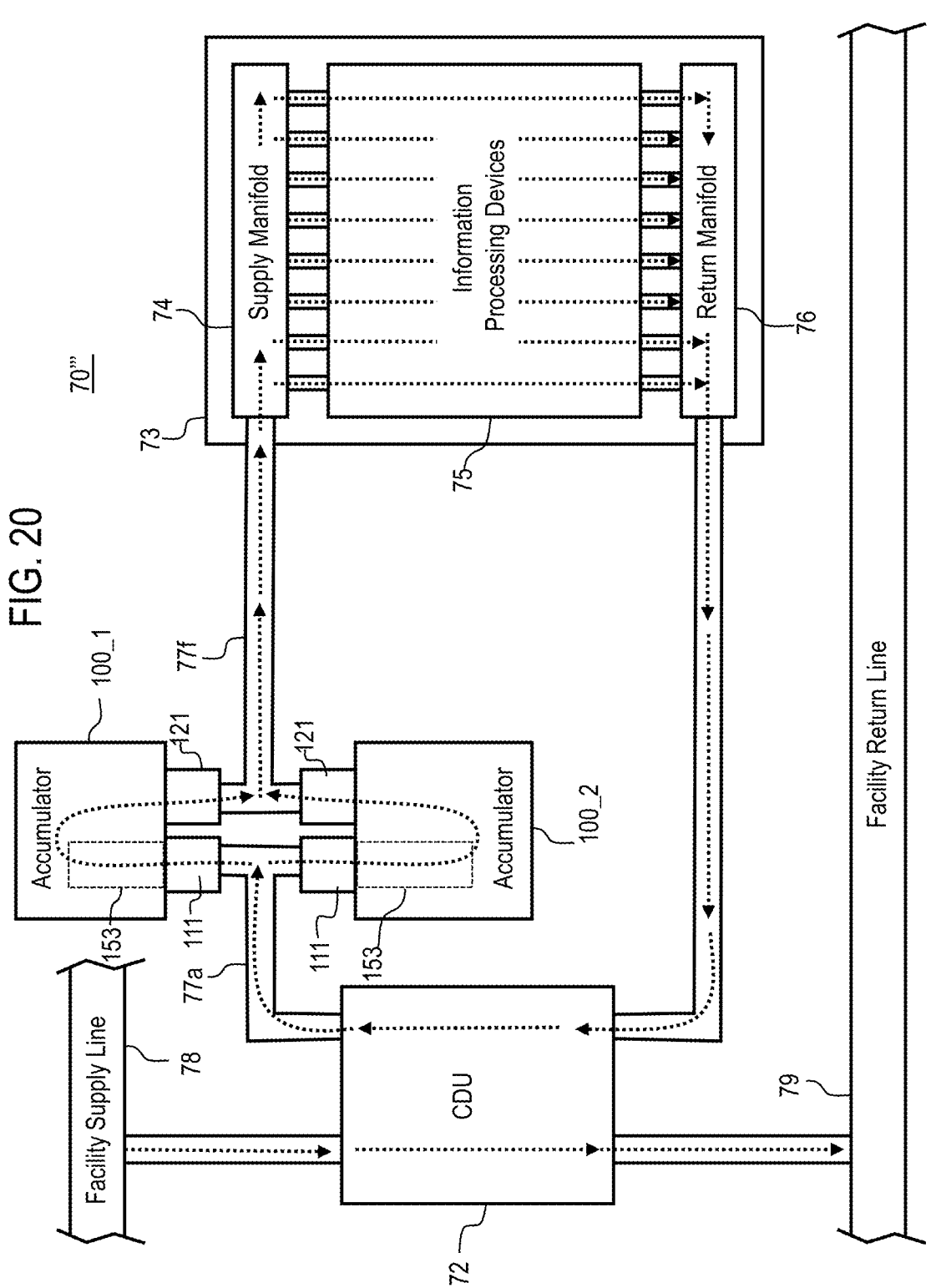
FIG. 20 is a block diagram schematically illustrating another example information processing system with liquid cooling loop having two flow-through folding membrane accumulators in parallel.

As another example, FIG. 20 illustrates the system 70''', which is the same as the system 70 except that two accumulators 100 are coupled into the supply side piping 77. In this example, the accumulators 100 are arranged in parallel with one another. That is, the inlet couplers 111 of the accumulators 100_1 and 100_2 are both coupled (directly or indirectly) to same conduit portion 77*a*, and similarly the outlet couplers 121 are both coupled (directly or indirectly) to the same conduit portion 77*f*, such that the accumulators 100_1 and 100_2 form two alternative parallel paths for liquid flowing through the supply side piping 77. Thus, liquid flows through both accumulators 110 concurrently in parallel. Although not illustrated, in some examples the piping 77 may also comprise one or more bypassing paths which may couple various portions of the piping 77 together to form an alternate fluid flow path. For example, a bypass may connect portion 77*a* directly to portion 77*f*, thus forming a third parallel path from portion 77*a* to portion 77*f*. In some examples, the accumulators 100 or the conduits 77*a* and/or 77*f* could be fitted with check valves. The check valves ensure fluid enters the accumulators 100 on one end, and exits from the other end, thus preventing fluid from exiting back out the same opening from which it entered (such as during a momentary pressure spike), and preventing stagnant flow from developing within the accumulator 100.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within +1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A flow-through accumulator for a liquid cooling system, comprising;
   a housing having an interior volume;
   an inlet portion coupled to the housing;
   an outlet portion coupled to the housing;
   a folding flexible membrane disposed in the interior volume of the housing,
   wherein the membrane defines an interior liquid channel extending through the membrane along a longitudinal axis of the membrane,
   wherein the accumulator is configured to receive liquid coolant via the inlet portion, flow the liquid coolant from the inlet portion through the interior liquid channel to the outlet portion, and output the flow of liquid coolant from the accumulator via outlet portion,
   wherein the membrane is sealed to the housing such that an air-tight cavity filled with a gas is formed between the housing and the membrane, the cavity radially surrounding the internal liquid channel with the membrane separating the cavity and the internal liquid channel, and
   wherein the membrane comprises a plurality of folds extending parallel to the longitudinal axis and distributed circumferentially around the longitudinal axis.

2. The flow-through accumulator of claim 1, wherein the folds alternate in respective fold direction and form a plurality of folded portions.

3. The flow-through accumulator of claim 1, wherein the membrane comprises integrated gaskets disposed at opposite ends of the membrane, and wherein the integrated gaskets are positioned outside the housing and abut respective end faces of the housing to form the seal between the membrane and the housing.

4. The flow-through accumulator of claim 1, wherein a volume of the cavity and a volume of the internal liquid channel vary in inverse relationship to one another in response to deformation of the membrane and based on a pressure in a liquid cooling loop to which the accumulator is coupled.

5. The flow-through accumulator of claim 1, comprising:
   a first end cap coupled to the housing, wherein a first integrated gasket of the integrated gaskets is clamped between the first end cap and a first end face of the end faces of the housing; and
   a second end cap coupled to the housing, wherein a second integrated gasket of the integrated gaskets is clamped between the second end cap and a second end face of the end faces of the housing.

6. The flow-through accumulator of claim 5, wherein the inlet portion comprises an inlet coupler coupled to the first end cap, and wherein the outlet portion comprises an outlet coupler coupled to the first end cap.

7. The flow-through accumulator of claim 6, comprising:
   an outer housing, wherein housing is disposed within an interior volume of the outer housing,
   wherein an outlet conduit is formed in the space between the housing and the outer housing,
   wherein the liquid coolant, after exiting the interior liquid channel, flows through the outlet conduit to the outlet coupler, and
   wherein the liquid coolant flows along a first direction while flowing through the interior liquid and along a second direction while flowing through the outlet conduit, the second direction being opposite the first direction.

8. The flow-through accumulator of claim 7, wherein the second end cap comprises a flow redirecting portion which is coupled to the housing and which redirects the liquid coolant exiting the interior liquid channel into the outlet conduit, wherein a portion of the flow redirecting portion extends between the housing and the outer housing.

9. The flow-through accumulator of claim 8, wherein the second end cap comprises cap portion coupled to the flow redirecting portion and coupled to an exterior surface of the outer housing.

10. The flow-through accumulator of claim 8, wherein the flow redirecting portion clamps one of the integrated gaskets against one of the end faces of the housing.

11. The flow-through accumulator of claim 7, wherein the first end cap comprises an inlet conduit which couples the inlet coupler to an inlet of the outer housing, wherein the inlet conduit is configured to separate the liquid coolant flowing from the inlet coupler to the outer housing from the liquid coolant flowing from the outlet conduit to the outlet coupler.

12. The flow-through accumulator of claim 6, wherein the inlet coupler and the outlet coupler are quick-disconnect liquid couplers.

13. The flow-through accumulator of claim 5, wherein the inlet portion comprises an inlet coupler coupled to the first end cap, and wherein the outlet portion comprises an outlet coupler coupled to the second end cap.

14. The flow-through accumulator of claim 13, comprising:
a flexible tube connecting the outlet coupler coupled to the second end cap.

15. An information processing system, comprising:
one or more information processing devices;
a liquid cooling system configured to circulate the liquid coolant through a coolant loop thermally coupled to the information processing devices; and the accumulator of claim 1 fluidically coupled to coolant loop such that at least a portion of the liquid coolant circulating through the coolant loop flows through the interior liquid chamber.

16. The information processing system of claim 15, wherein the coolant loop comprises supply side piping configured to supply the liquid coolant to the information processing devices, and wherein the accumulator is fluidically coupled to the supply side piping.

17. The information processing system of claim 15, comprising a second accumulator coupled in series with the accumulator.

18. The information processing system of claim 15, comprising a second accumulator coupled in parallel with the accumulator.

19. A method comprising:
receiving input liquid coolant at an inlet portion of a flow-through accumulator;
flowing the liquid coolant from the inlet portion to an interior liquid channel of the accumulator, the interior liquid channel being defined by a folding flexible membrane of the accumulator and extending through the membrane along a longitudinal axis of the membrane, wherein the membrane is disposed within an interior volume of a housing;
flowing the liquid coolant from the interior liquid channel to an outlet portion of the accumulator; and
changing a volume of the internal liquid chamber and of an air-tight cavity formed between the membrane and the housing by deforming the membrane, which separates the internal liquid chamber from the cavity, wherein the cavity radially surrounds the internal liquid chamber,
wherein the membrane comprises a plurality of folds extending parallel to the longitudinal axis and distributed circumferentially around the longitudinal axis.

20. The method of claim 19, further comprising:
circulating the liquid coolant through a coolant loop thermally coupled to information processing devices and fluidically coupled to the accumulator; and
directing at least a portion of the liquid coolant through the interior liquid chamber of the accumulator.

* * * * *